United States Patent
Faue (12)

(10) Patent No.: US 6,337,830 B1
(45) Date of Patent: Jan. 8, 2002

(54) INTEGRATED CLOCKING LATENCY AND MULTIPLEXER CONTROL TECHNIQUE FOR DOUBLE DATA RATE (DDR) SYNCHRONOUS DYNAMIC RANDOM ACCESS MEMORY (SDRAM) DEVICE DATA PATHS

(75) Inventor: Jon Allan Faue, Colorado Springs, CO (US)

(73) Assignee: Mosel Vitelic, Inc., Hsinchu (TW)

(*) Notice: Subject to any disclaimer, the term of this patent is extended or adjusted under 35 U.S.C. 154(b) by 0 days.

(21) Appl. No.: 09/652,271

(22) Filed: Aug. 31, 2000

(51) Int. Cl.$^7$ ................................................ G11C 8/00
(52) U.S. Cl. .................................. 365/230.04; 365/233
(58) Field of Search ........................... 365/230.04, 233, 365/189.04, 230.02, 230.03

(56) References Cited

U.S. PATENT DOCUMENTS

| | | | | |
|---|---|---|---|---|
| 5,768,177 A | * | 6/1998 | Sakuragi | 365/194 |
| 5,835,444 A | * | 11/1998 | Kim et al. | 365/233 |
| 6,011,749 A | * | 1/2000 | Roth et al. | 365/233 |
| 6,055,210 A | * | 4/2000 | Setogawa | 365/233 |
| 6,111,812 A | * | 8/2000 | Gans et al. | 365/233 |
| 6,125,064 A | * | 9/2000 | Kim et al. | 365/193 |

* cited by examiner

Primary Examiner—Amir Zarabian
Assistant Examiner—Anh Phung
(74) Attorney, Agent, or Firm—William J. Kubida; Hogan & Hartson LLP

(57) ABSTRACT

An integrated circuit memory device including at least one memory bank with the memory bank being logically partitioned into even and odd portions thereof. Even and odd data buses are provided which are selectively couplable to the even and odd portions of the memory banks respectively for placing read data thereon by means of corresponding first multiplexers in response to a first control signal. A read pipeline sorting block is coupled to the even and odd data buses for selectively applying the read data on the even data bus to either of a rising or falling edge data output bus and the read data on the odd data bus to an opposite one of the rising or falling edge data output buses. In a particular embodiment disclosed herein, the memory device may further include a write pipeline sorting block coupled to the rising and falling edge data buses for receiving write data thereon, the write pipeline sorting block selectively applies the write data on the rising edge data bus to either of the even or odd data buses and the write data on the falling edge data bus to an opposite one of the even or odd data buses. The integrated clocking latency and multiplexer control technique for DDR SDRAM device data paths which has been particularly disclosed completely integrates the clocking, control of the various input/output ("I/O") configurations and implementation of various clocking latencies.

24 Claims, 20 Drawing Sheets

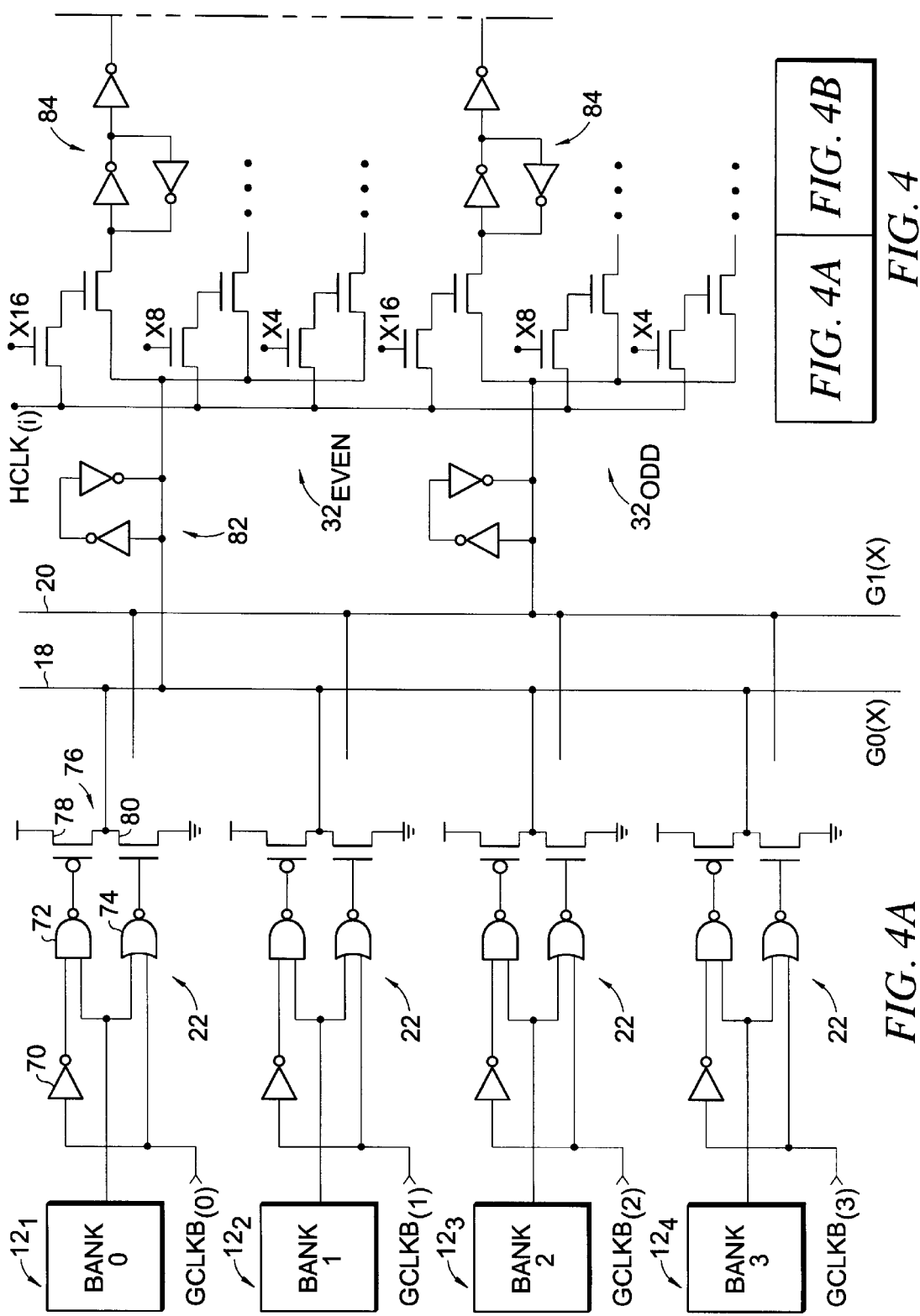

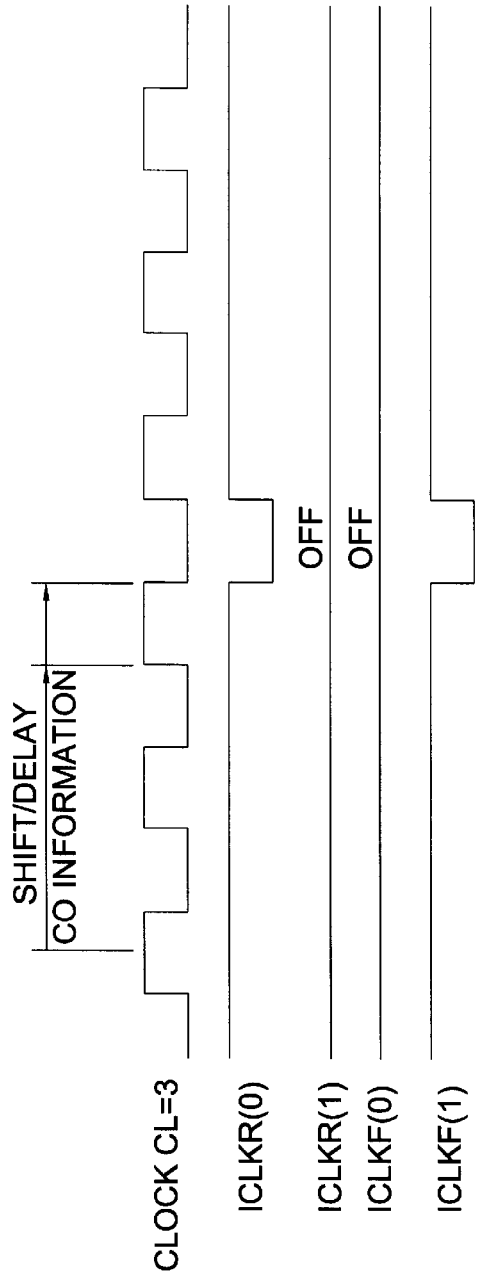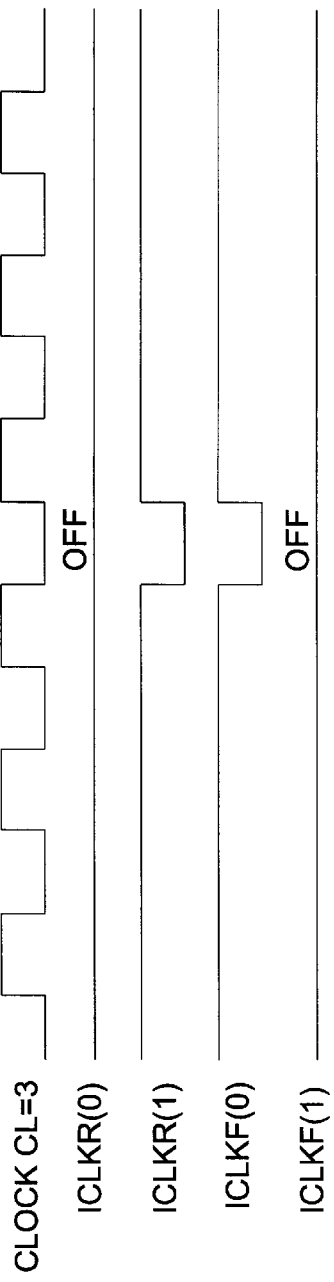

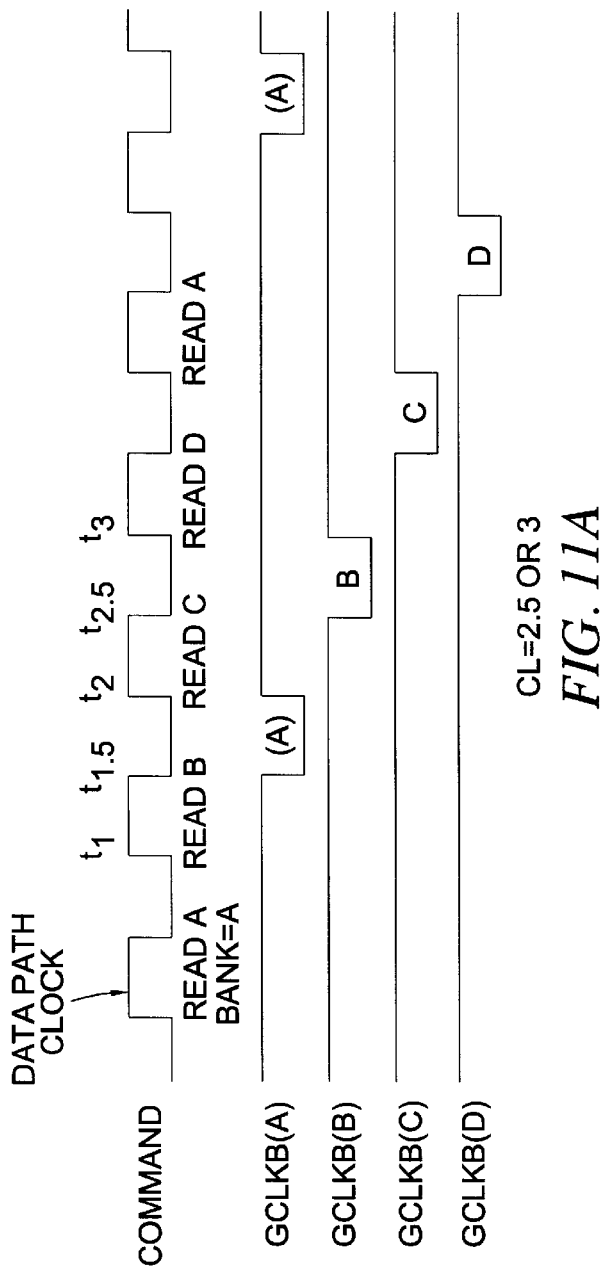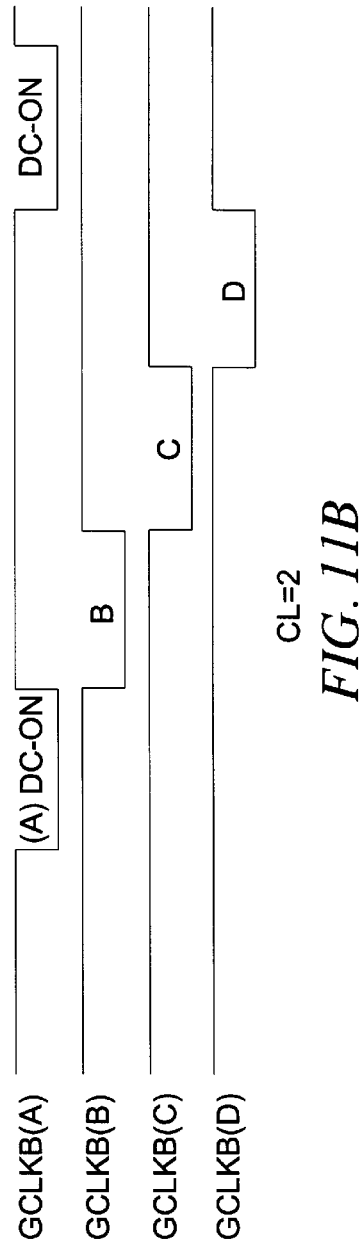
FIG. 11A CL=2.5 OR 3
FIG. 11B CL=2

INTEGRATED CLOCKING LATENCY AND MULTIPLEXER CONTROL TECHNIQUE FOR DOUBLE DATA RATE (DDR) SYNCHRONOUS DYNAMIC RANDOM ACCESS MEMORY (SDRAM) DEVICE DATA PATHS

CROSS REFERENCE TO RELATED PATENT APPLICATIONS

The subject matter of the present invention is related to that disclosed in U.S. patent applications Ser. No.: 09/527,043 filed Mar. 16, 2000 for "Integrated Data Input Sorting and Timing Circuit for Double Data Rate (DDR) Dynamic Random Access Memory (DRAM) Devices"; 09/527,048 filed Mar. 16, 2000 for "System and Method for Supporting Sequential Burst Counts in Double Data Rate (DDR) Synchronous Random Access Memories (SDRAM)" and Ser. No. 09/524,644 filed Mar. 14, 2000 for "Arbitration Method and Circuit for Control of Integrated Circuit Double Data Rate (DDR) Memory Device Output First-In, First-Out (FIFO) Registers", all assigned to Mosel Vitelic, Inc., assignee of the present invention, the disclosures of which are specifically incorporated herein by this reference.

BACKGROUND OF THE INVENTION

The present invention relates, in general, to the field of integrated circuit ("IC") memory devices. More particularly, the present invention relates to an integrated clocking latency and multiplexer control technique for double data rate ("DDR") synchronous dynamic random access memory ("SDRAM") device data paths.

SDRAM memory devices function somewhat differently than conventional random access memory devices such as DRAM and take advantage of the fact that most computer system memory access are, in fact, sequential. Consequently, SDRAM devices are designed to fetch the initial and ensuing data bits in a burst as quickly as possible. An on-chip burst counter allows the column portion of the address to be incremented rapidly in order to significantly speed retrieval of information in sequential read operations. The associated memory controller furnishes the first column address location and size of the block of memory to be accessed and the SDRAM memory device itself provides the read out bits as fast as the central processing unit ("CPU") can take them, utilizing a clock to synchronize the timing between the CPU and memory device. In DDR SDRAM devices, this first column address location is supplied on the rising edge of the clock. However, the address for the data to be output on the falling edge of the clock may be obtained at this point in time in high-speed devices in order to be able to meet the data frequency requirements.

Historically, in order to synchronize data transfers among system logic devices, data transfers to/from conventional DRAM devices would be initiated on either the rising (the transition from logic level "zero" to "one") or falling (the transition from logic level "one" to "zero") edge of a clock signal. DDR SDRAM memory devices differ from conventional SDRAM by enabling output operations to occur on both the rising and falling edges of the clock, thereby effectively doubling the device's output frequency without increasing the actual clock frequency.

In conventional DDR SDRAM designs, the data read out of the device is clocked out utilizing the system clock. In addition, multiple input/output ("I/O") configuration changes are also generally handled with a separate circuit, that is, one each to provide a X4, X8, X16 or other configurations. Moreover, in conventional designs, changes in "read" latency are often handled by providing entirely separate data paths. Still further, combining several modes of operation and differing functions into a single data path design could readily lead to a very complicated design that is also extremely slow.

SUMMARY OF THE INVENTION

Disclosed herein is an integrated clocking latency and multiplexer control technique for DDR SDRAM device data paths in which the clocking, control of the various I/O configurations and implementation of the various latencies are completely integrated. This further results in a robust and extremely efficient method of implementing all these functions which is easily transportable to other memory device designs.

In a particular embodiment disclosed herein, the "read" data pipeline is divided into as many portions as necessary to support the maximum latency of the device, which, in the example given, is three clock cycles following assertion of a "read" command. A particular clock signal is assigned to each stage of the pipeline, and for DDR memory devices, everything shifts on the one half cycle.

The first clock signal in the "read" pipeline is assigned to fetch data from the proper bank of the memory array. The order is preferential, since dealing with data from multiple banks in parallel would result in the requirement of many more data lines. The second clock signal is assigned to only fetch the proper data based on the I/O configuration of the part, that is, if the part is a X4 device, and the maximum configuration is X16, a 1 of 4 selection must be performed. The third and fourth clock signals are assigned to effectuate the odd/even sorting in preparing the data to be read out in a conventional DDR fashion. At this point, more clock signals can be added as necessary to achieve the desired latency. In the representative embodiment disclosed herein, a fifth clock signal is also disclosed. In the use of the technique of the present invention, the "position" and logic used to generate the above clock signals is what changes to achieve the various latencies and the data path itself does not change.

Particularly disclosed herein is an integrated circuit memory device comprising at least one memory bank, the memory bank being logically partitioned into even and odd portions thereof. Even and odd data buses are provided, the even and odd portions of the memory bank being selectively couplable to the even and odd data buses respectively for placing read data thereon by means of corresponding first multiplexers in response to a first control signal. A read pipeline sorting block is coupled to the even and odd data buses for selectively applying the read data on the even data bus to either of a rising or falling edge data output bus and the read data on the odd data bus to an opposite one of the rising or falling edge data output buses. In a particular embodiment disclosed herein, the memory device may further comprise a write pipeline sorting block coupled to the rising and falling edge data buses for receiving write data thereon, the write pipeline sorting block for selectively applying the write data on the rising edge data bus to either of the even or odd data buses and the write data on the falling edge data bus to an opposite one of the even or odd data buses.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 4, comprising FIGS. 4A and 4B, is a more detailed schematic illustration of particular embodiments of the G, H and I multiplexers in the "read" data path of the preceding figures;

FIGS. 9 and 10 are representative timing diagrams illustrative of the I clock signal functionality wherein, if "even" data is directed to the "rising" edge data bus, then "odd" data is directed to the "falling" edge data bus and vice versa;

FIGS. 11A and 11B are further representative timing diagrams illustrative of the GCLKB signal functionality for situations wherein CL=3 or 2.5 and CL=2 respectively;

DESCRIPTION OF A REPRESENTATIVE EMBODIMENT

Figure 1:
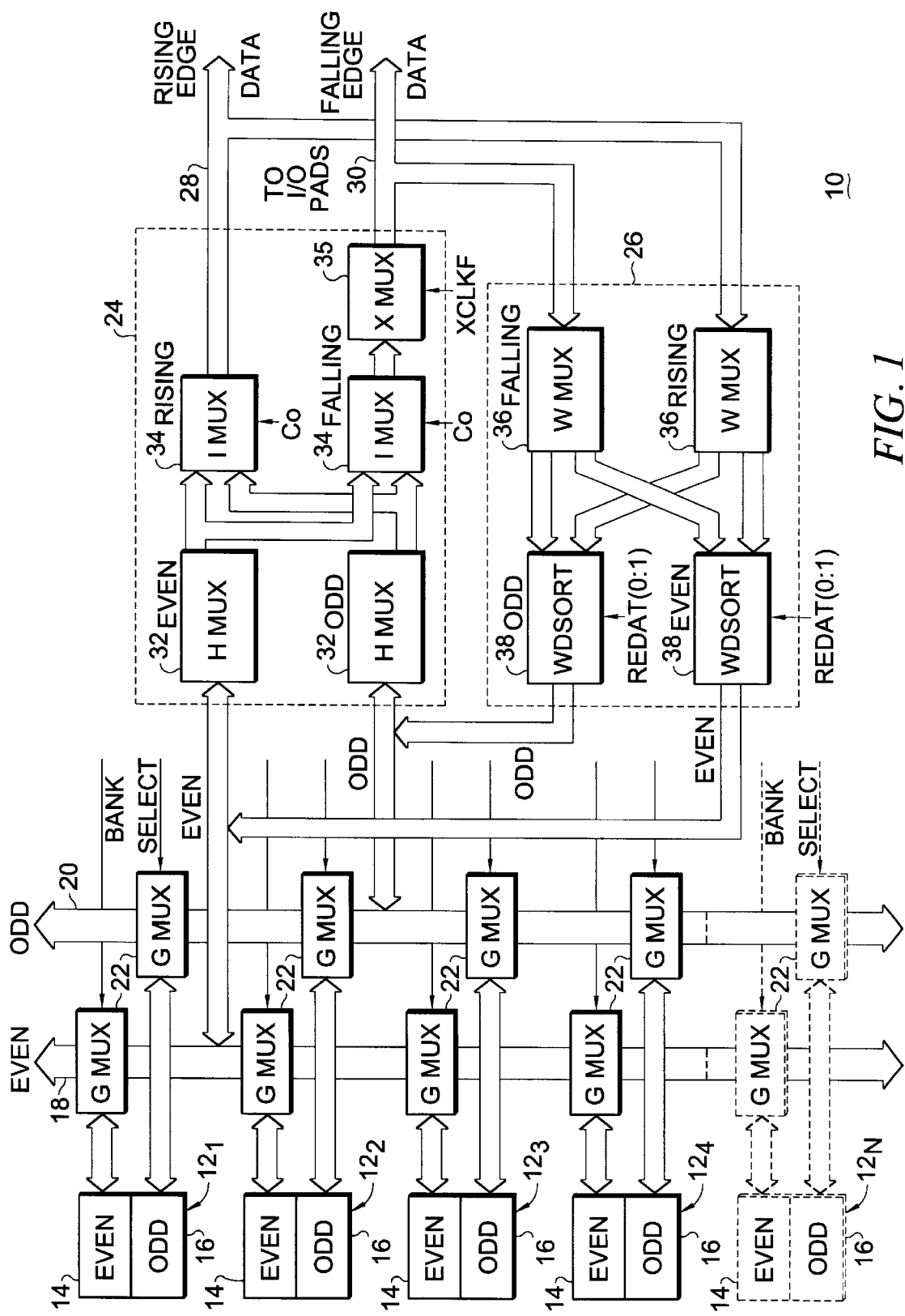
FIG. 1 is an overall functional block diagram of the read and write data paths in a representative DDR SDRAM device embodiment of the present invention illustrating the logical partitioning of the memory banks into "odd" and "even" portions thereof, the corresponding pair of global "odd" and "even" data buses and the "read" and "write" pipeline sorting blocks.

With reference now to FIG. 1, an overall functional block diagram of the read and write data paths in a representative DDR SDRAM device 10 of the present invention is shown.

The memory device 10 memory array comprises, in pertinent part, a number of memory banks $12_1$, $12_2$, $12_3$, $12_4$ through $12_N$, each of which may comprise any number of memory subarrays, to which data may be written and from which data may be read. In accordance with the principles of the present invention, each of the memory banks 121, 122, $12_3$, $12_4$ through $12_N$ is logically partitioned into and "even" portion 14 and an "odd" portion 16. The "even" portions 14 of the memory banks 12 are bidirectionally coupled by means of, for example, a 16 bit data bus to a global EVEN data bus 18 through a corresponding G Multiplexer ("G mux") 22. In like manner, the "odd" portions 16 of the memory banks 12 are also bidirectionally coupled by means of a corresponding data bus to a global ODD data bus 20 through another corresponding G mux 22. The G muxes 22 are selectively activated by means of an associated bank select signal as will be described more fully hereinafter.

The EVEN and ODD data buses 18 and 20 are respectively coupled to provide data read out from the "even" portions 14 of the memory banks $12_1$, $12_2$, $12_3$, $12_4$ through $12_N$ to a "read" pipeline sorting block 24, which ultimately supplies the data to either the "rising" data bus 28 or "falling" data bus 30 coupled to the memory device 10 input/output ("I/O") data pads. Data to be written to the memory device 10 memory banks 12 is also supplied on the "rising" and "falling" data buses 28, 30 to be supplied as input to a "write" pipeline sorting block 26 for selective application to either the EVEN or ODD data buses 18, 20.

The "read" pipeline sorting block 24 comprises a pair of H muxes $32_{EVEN}$ and $32_{ODD}$ respectively coupled to the EVEN and ODD data buses 18, 20. Depending upon the state of the X4/X8/X16 control signals, either all bits will be clocked directly through (i.e. in the case of a X16 memory device 10) or the field of sixteen bits will be restricted to eight or four as appropriate. Output from the of H muxes $32_{EVEN}$ and $32_{ODD}$ (which may be denominated as "Even" and "Odd" H buses respectively) is supplied to both the I mux $34_{RISING}$ and I mux $34_{FALLING}$ where such will ultimately be selectively provided to one or the other of the "rising" data bus 28 or "falling" data bus 30 in accordance with $C_0$ sorting signal hereinafter also denominated ICLKR and ICLKF respectively. The I mux $34_{FALLING}$ also includes an X mux 35 coupling its output to the "falling" data bus 30 as shown, which will be described in more detail hereinafter.

Correspondingly, data to be written to the memory device 10 which is furnished on the "rising" data bus 28 or "falling" data bus 30 is supplied to a corresponding one of the W muxes $36_{RISING}$ and $36_{FALLING}$. No control signal need be applied to the W muxes $36_{RISING}$ and $36_{FALLING}$, the outputs of which are supplied to both of the WDSORT blocks $38_{EVEN}$ and $38_{ODD}$. The WDSORT blocks $38_{EVEN}$ and $38_{ODD}$ are controlled by REDAT (0:1) control signals as disclosed in greater detail in the aforementioned U.S. patent application Ser. No. 09/527,043.

In operation, the "rising" edge data and "falling" edge data to be written to the memory device 10 will ultimately be provided through the "write" pipeline sorting block 26 to the EVEN data bus 18 and the ODD data bus 20 respectively, or vice versa. In this manner, the "rising" edge data and "falling" edge data will ultimately be written to the "even" and "odd" portions 14, 16 of the memory banks 12 respectively, or vice versa.

Figure 2:
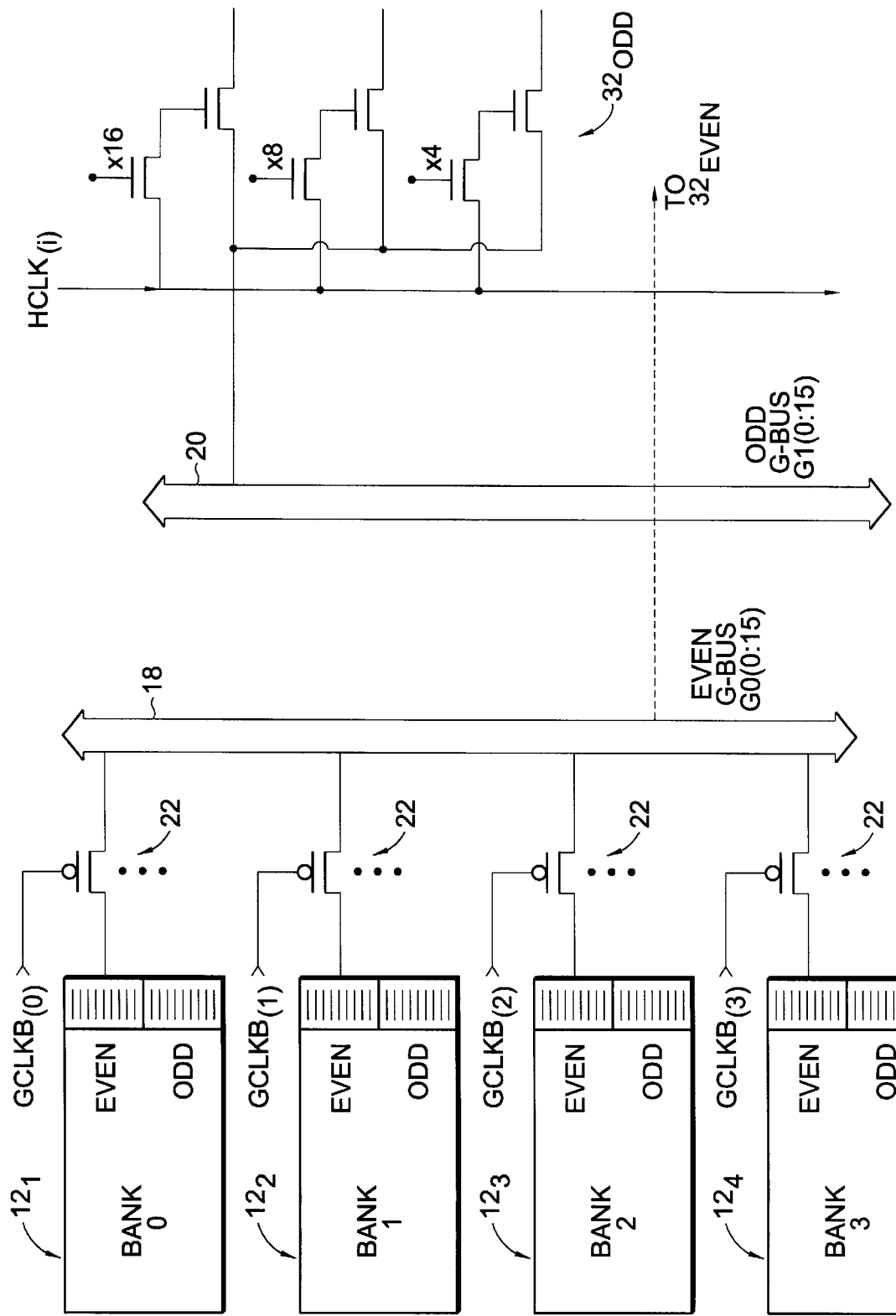
FIG. 2 is a partial functional block diagram of the DDR SDRAM device of FIG. 1 particularly illustrating the clock steering functions of the G and H multiplexers in the "read" data path.

With reference additionally now to FIG. 2, a partial functional block diagram of the DDR SDRAM device 10 of FIG. 1 is shown. With respect to this figure, like structure to that previously described has been like numbered and the foregoing description thereof shall suffice herefor. This figure particularly illustrates the clock steering functions of the G and H multiplexers 22, 32 in the "read" data path of the memory device 10.

As illustrated, the G muxes 22 may be logically equated to P-channel MOS transistors individually coupling the rows of the "even" and "odd" portions of the memory banks $12_1$, through $12_4$ (Banks 0 through 3 in a representative four bank device) to the EVEN data bus 18 and ODD data bus 20 respectively by means of G Clock bar ("GCLKB") signals GCLKB(0) through GCLKB(3) applied to the gates terminals of the MOS devices. The GCLKB(0) through GCLKB(3) signals are the equivalent of the "Bank Select" signals of the preceding figure.

The global EVEN and ODD data buses 18, 20 in this embodiment are 16 bits wide (0:15) and are respectively coupled to the H muxes $32_{EVEN}$ and $32_{ODD}$. The gate level details of the H mux $32_{ODD}$ is illustrated in detail and shows the H Clock ("HCLK") signals HCLK(i), where "i" corresponds to X4 addresses. The gate terminals of the cascade connected transistor pairs are coupled to receive a X4, X8 or X16 signal as shown.

Figure 3:
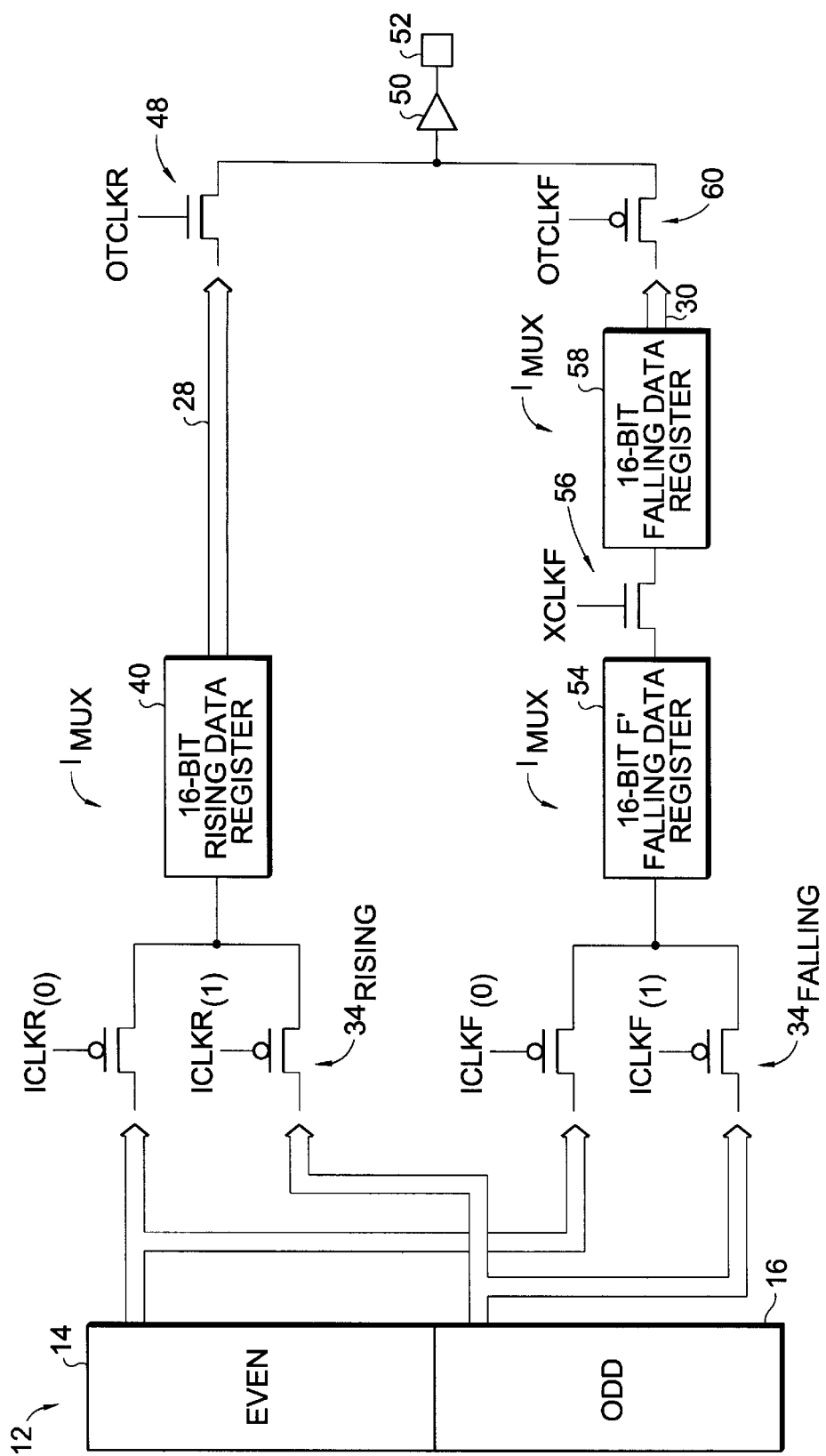
FIG. 3 is a follow-on functional block diagram of the "read" data path of the preceding figures illustrating the clock steering function of the I multiplexers, the output clocking and the falling data path X clocking functions.

With reference additionally now to FIG. 3, a follow-on functional block diagram of the "read" data path of the preceding figures illustrating the clock steering function of the I multiplexers 34, the output clocking and the falling data path X clocking functions thereof. The output of the H muxes $32_{EVEN}$ and $32_{ODD}$ illustrated in the preceding figure, in accordance with the HCLK(0:3) and X4, X8 and X16 signals, and in conjunction with the I Clock ("ICLK") signals ICLKR(0:1) (for rising edge data) and ICLKF(0:1) (for falling edge data) determine whether or not the "even" data is going to be mapped to either the "rising" or "falling" edge data, with the "odd" data going to the opposite edge data.

The ICLKR(0:1) and ICLKF(0:1) signals are equivalent to the $C_0$ Sorting signals indicated in the preceding FIG. 1 and the I muxes may comprise simple P-channel devices in conjunction with an associated register 40 (for rising edge data) and a register 54 (for falling edge data). The output of the register 40 is supplied on the "rising" data bus 28 for input to a number of N-channel output clock switching devices 48 which receive an output clock rising ("OTCLKR") signal at the gates thereof. The "rising" edge data is then amplified by an amplifier stage 50 for output on the memory device 10 output pads 52.

The output of the register 54 is supplied through a number of switching devices 56 (which receive respective X Clock "falling" ("XCLKF") signals at the gate terminals thereof) for input to another register 58 which may be like configured to that of register 54. The output of register 58 is then supplied on the "falling" data bus 30 for input to a number of P-channel output clock switching devices 60 which receive an output clock falling ("OTCLKF") signal at the gates thereof. The "falling" edge data is then also amplified by the amplifier stage 50 for output on the memory device 10 output pads 52.

As illustrated in the preceding figures, a series of five clock signals are used to move data through a number of registers so it can be read out in DDR fashion. These five clock signals include three primary clock signals (HCLK, ICLKR, ICLKF) together with (GCLKB) and (XCLKF) in the particular embodiment shown. Stated another way, the read data pipeline utilizes the following clock signals:

First Clock Signal=GCLKB(0:3) 1/4 of memory banks addressed;

Second Clock Signal=HCLK(0:3) 1/4 multiplexer ("mux") select for X4; 2/4 mux select for X8; 4/4 mux select for X16;

Third Clock Signal=ICLKR(0:1) rising edge data=$C_0$=0 or $C_0$=1;

Fourth Clock Signal=ICLKF(0:1) falling edge data= opposite state of $C_0$ for ICLKR; and Fifth clock Signal=XCLKF an extra clock in the "falling" path for latency control.

In particular, the memory device 10 provides a DDR data path design with an efficient method for combining multiple I/O configurations (i.e., X4, X8, X16), multiple read latencies (i.e., 2, 2.5, 3 clock cycles) into a single data path capable of DDR (Double Data Rate) function. Read and write functions are also incorporated.

In the implementation of the present invention illustrated, all aspects of the data paths shown are operated off of the memory device 10 delay locked loop ("DLL") clock for "read" timing. A particularly efficacious system and method for arbitrating the data flow between the system and DLL clocks is disclosed in the aforementioned U.S. patent application Ser. No. 09/524,644.

Figure 4B:
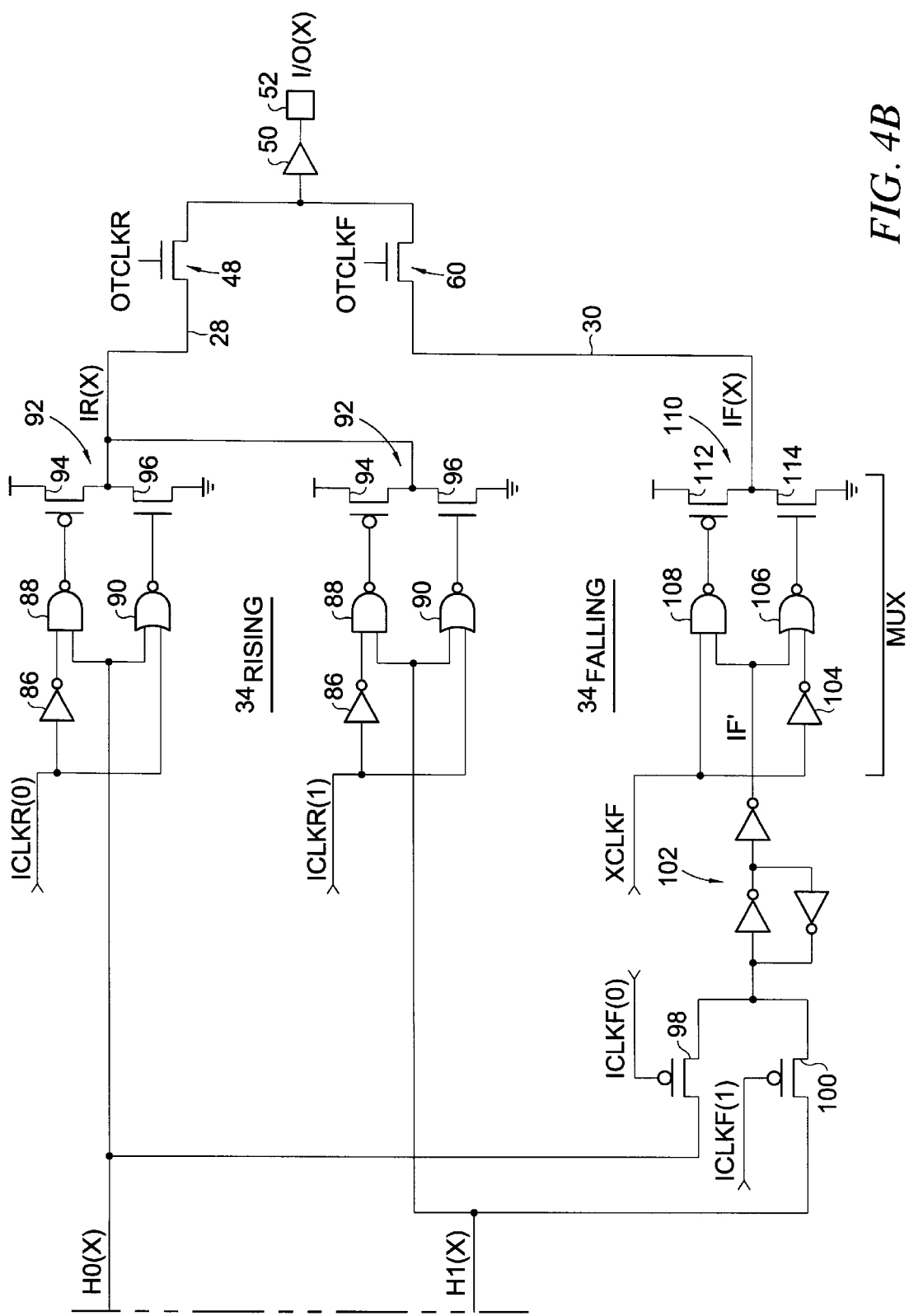

With reference additionally now to FIG. 4, (comprising FIGS. 4A and 4B), a more detailed schematic illustration of particular embodiments of the G, H and I multiplexers in the "read" data path of the preceding figures is shown. In this illustration, the G muxes 22 are shown to comprise an inverter 70 for receiving one of a GCLKB(0) through GCLKB(3) signal at an input thereof. Data read out from the corresponding one of the memory banks $12_1$, through $12_3$ is furnished to one input of two input NAND gate 72 and one input of two input NOR gate 74. The output of the inverter 70 is coupled to the remaining input of the NAND gate 72 while the input of the inverter 70 is coupled to the remaining input of the NOR gate 74.

The output of the NAND gate 72 is coupled to the gate of a P-channel transistor 78 forming a portion of an inverter 76 coupled between a source of supply voltage and circuit ground. Similarly, the output of the NOR gate 74 is coupled to the input of an N-channel transistor 80 of the inverter 76. The output of the inverter 76 taken at the node intermediate the P-channel transistor 78 and the N-channel transistor 80 is then applied to the corresponding one of either the "EVEN" data bus 18 or the "ODD" data bus 20, depending on whether the G mux 22 is associated with the even or odd portion 14, 16 of the corresponding memory bank 12. In operation, the G mux 22 configuration shown allows for the multiplexer to be selectively placed in an "on", "off" or high impedance (high "Z") state depending on the associated GCLKB signal.

The "EVEN" and "ODD" data buses 18, 20 are coupled to a number of latches 82, comprising cross-coupled inverters as shown, to the H muxes $32_{EVEN}$ and $32_{ODD}$ respectively as previously described. Output from the H muxes $32_{EVEN}$ and $32_{ODD}$ is then provided through registers 84 to both of the I muxes $34_{RISING}$ and $34_{FALLING}$. Output from the H mux $32_{EVEN}$ [H0 (X)] is furnished to one input of two input NAND gate 88 and one input of two input NOR gate 90 as shown as well as to one terminal of a P-channel transistor 98. The signal ICLKR(0) is supplied both to an inverter 86, which has its output coupled to the remaining input of the NAND gate 88, and to the remaining input of NOR gate 90. Output of the NAND gate 88 is supplied to the gate terminal of P-channel transistor 94 forming a portion of an inverter 92 coupled between a source of supply voltage and circuit ground. In like manner, the output of NOR gate 90 is supplied to the gate terminal of N-channel transistor 96 of the inverter 92. The output of the inverter 92 provides a signal IR(x) on "rising" data bus 28.

Output from the H mux $32_{ODD}$ [H1 (X)] may also be selectively furnished to one input of another two input NAND gate 88 and one input of another two input NOR gate 90 as shown as well as to one terminal of another P-channel transistor 100. The signal ICLKR(1) is supplied both to another inverter 86, which has its output coupled to the remaining input of the other NAND gate 88, and to the remaining input of the other NOR gate 90. Output of the other NAND gate 88 is supplied to the gate terminal of the other P-channel transistor 94 forming a portion of another inverter 92 coupled between a source of supply voltage and circuit ground. In like manner, the output of the other NOR gate 90 is supplied to the gate terminal of another N-channel transistor 96 of the inverter 92. The output of the inverter 92 provides a signal IR(x) on "rising" data bus 28.

The remaining terminals of P-channel transistors 98, 100 are coupled together at the input of a register 102, each having its gate terminal coupled to receive an ICLKF(0) or ICLKF(1) signal as shown. The output of the register 102 is coupled to the input of I mux $34_{FALLING}$. I mux $34_{FALLING}$ receives the signal XCLKF at one input of two input NAND gate 108 and the input of inverter 104, which has its output coupled to one input of two input NOR gate 106. The remaining inputs of NAND gate 108 and NOR gate 106 are coupled to the output of the register 102. The output of NAND gate 108 is supplied to the gate terminal of P-channel transistor 112 comprising one portion of an inverter 110 coupled between a supply voltage source and circuit ground. The output of NOR gate 106 is supplied to the gate terminal of N-channel transistor 114 forming a portion of the inverter 110. The output of the inverter 110, IF(x) is supplied on the "falling" data bus 30.

The "rising" data bus 28 is coupled to one terminal of N-channel transistor 48 which has its gate terminal coupled to receive the OTCLKR signal. The remaining terminal of the N-channel transistor 48 is coupled to the output amplifier section 50 for application to the memory device 10 I/O pads 52. Similarly, the "falling" data bus 30 is coupled to one terminal of N-channel transistor 60 which has its gate terminal coupled to receive the OTCLKF signal. The remaining terminal of the N-channel transistor 60 is also coupled to the output amplifier stage 50 for application to the memory device 10 I/O pads 52. In operation, the I muxes $34_{RISING}$ and $34_{FALLING}$ may be selectively placed in an "on", "off" or high "Z" state depending upon the signals ICLKR and XCLKF.

Figure 5:
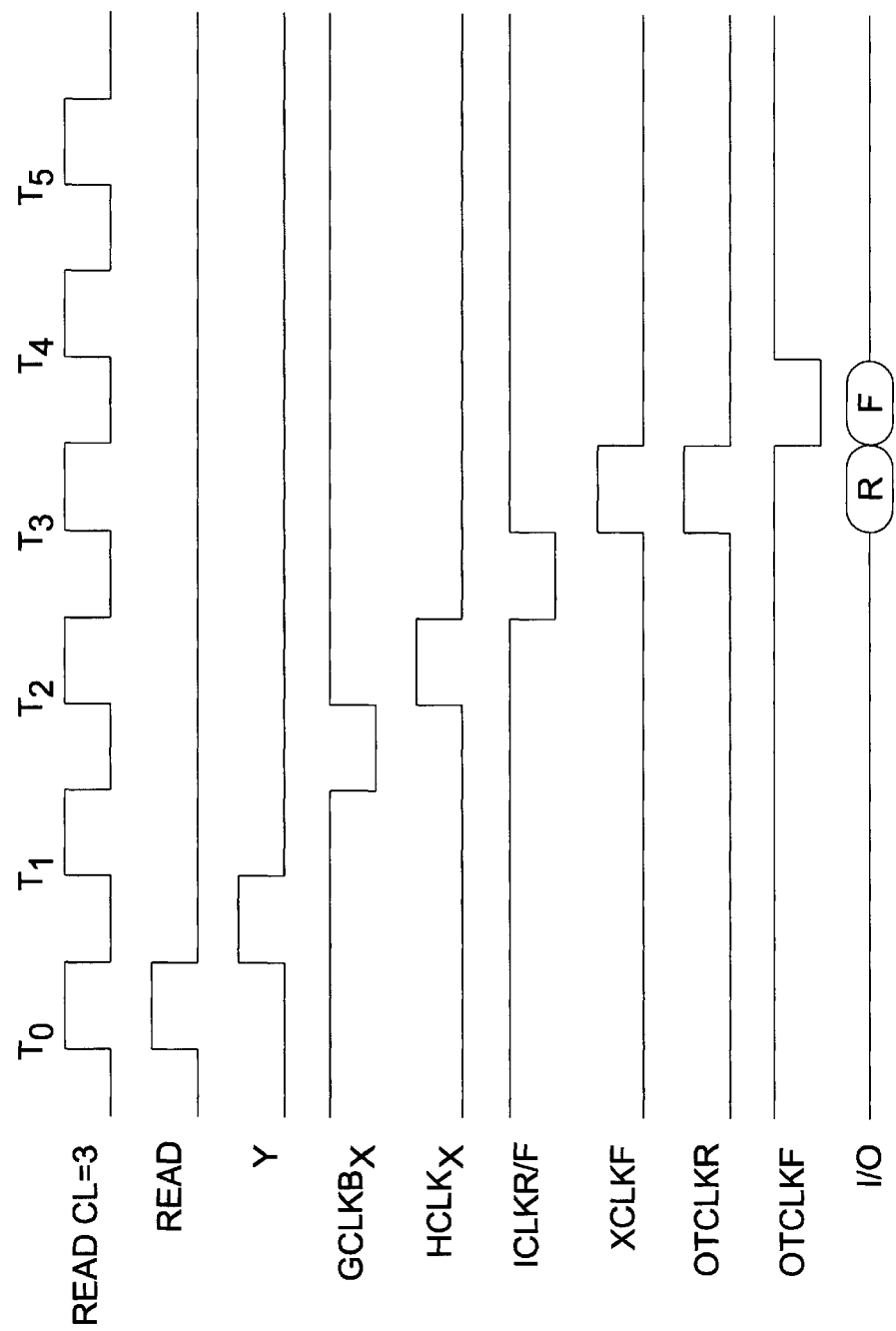
FIG. 5 is a representative timing diagram of the G, H, I, X and output clocks following receipt of a "read" command in relationship to the memory device clock and the data output on the device I/O pads in response thereto.

With reference additionally now to FIG. 5, a representative timing diagram of the G, H, I, X and output clocks is shown following receipt of a "read" command in relationship to the memory device clock as well as illustrating the memory device 10 data output in response thereto. The timing diagram illustrated corresponds to the memory device 10 structure particularly illustrated and described with respect to the preceding FIGS. 2 and 3 and having a latency of CL=3.

As shown, at time $T_0$ of the device data path clock signal, a "read" command is issued and on the falling edge of the "read" command, the "Y" signal is asserted, returning "low" at time $T_1$. One clock cycle following the "Y" signal going "high", the $GCLKB_X$ signal (supplied to the G muxes 22) goes "low" and, at time $T_2$, the HCLKX signal (supplied to the H muxes 32) goes "high. Following the return of the $HCLK_X$ signal to a logic "low" state, the ICLKR/F signals (supplied to the I muxes 34) go "low", returning to a "high" state at time $T_3$. At this point, the XCLKF signal (supplied to the gate terminal of N-channel transistor 56 in the falling data path) goes "high" along with the OTCLKR (or "OTR") signal supplied to the gate terminal of N-channel transistor 48. Rising data will appear at the memory device I/O pads 52 at this time. The OTCLKF (or "OTF") signal supplied to the gate terminal of P-channel transistor 60 goes "low" following the return of the OTCLKR signal to a logic "low" level and falling data will appear at the memory device I/O pads 52 at this time.

Figure 6:
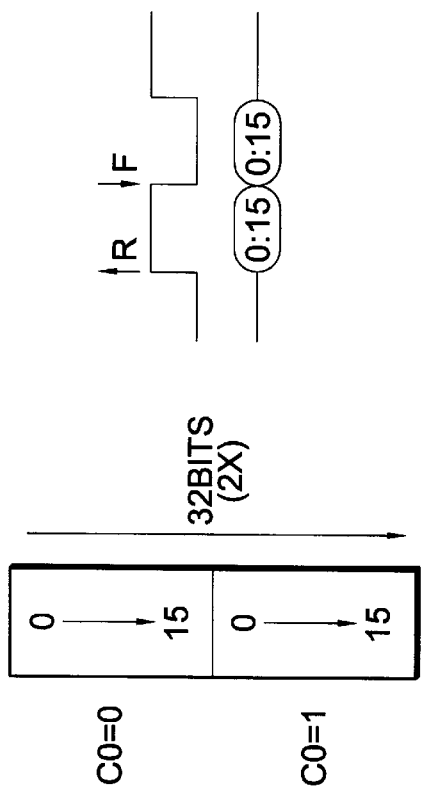
FIG. 6 is a simplified representation of a group of 32 data bits output from the memory device of the preceding figures as groups of 16 bits of even (or odd) data on the rising edge of the clock signal followed by 16 bits of odd (or even) data on the following falling edge of the clock signal depending on the C0 sorting.

With reference additionally now to FIG. 6, a simplified representation of a group of 32 data bits output from the memory device 10 of the preceding figures is shown as groups of 16 bits of even (or odd) data on the rising edge of the clock signal followed by 16 bits of odd (or even) data on the following falling edge of the clock signal depending on the C0 sorting to the I muxes $34_{RISING}$ and $34_{FALLINGA}$.

As can be seen, a "read" command generates 32 bits (i.e., the maximum I/O configuration x2). For example, for a "read" command issued with C0=0, then those 16 bits are issued first, followed by C0=1 data on the trailing edge. In the case of CL=2.5, or any "0.5" latency, first data is issued out on a falling edge.

Figure 7:
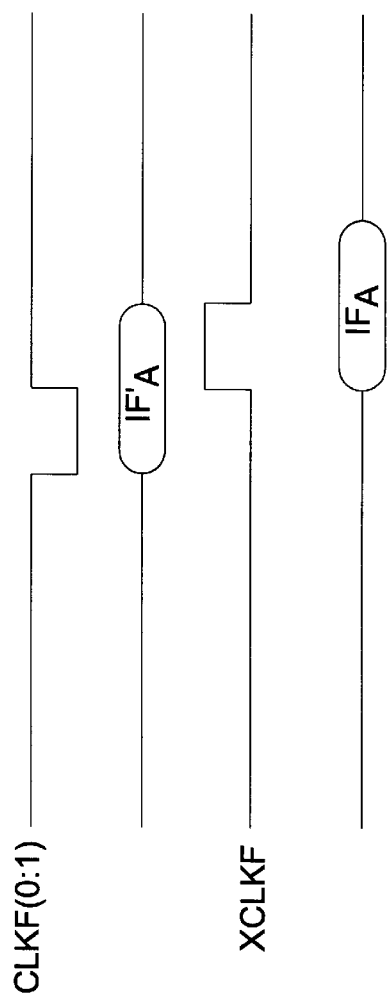
FIG. 7 is a timing diagram illustrating the relationship of the I and X clock signals to data packets corresponding to a given address "A"
Figure 12A:
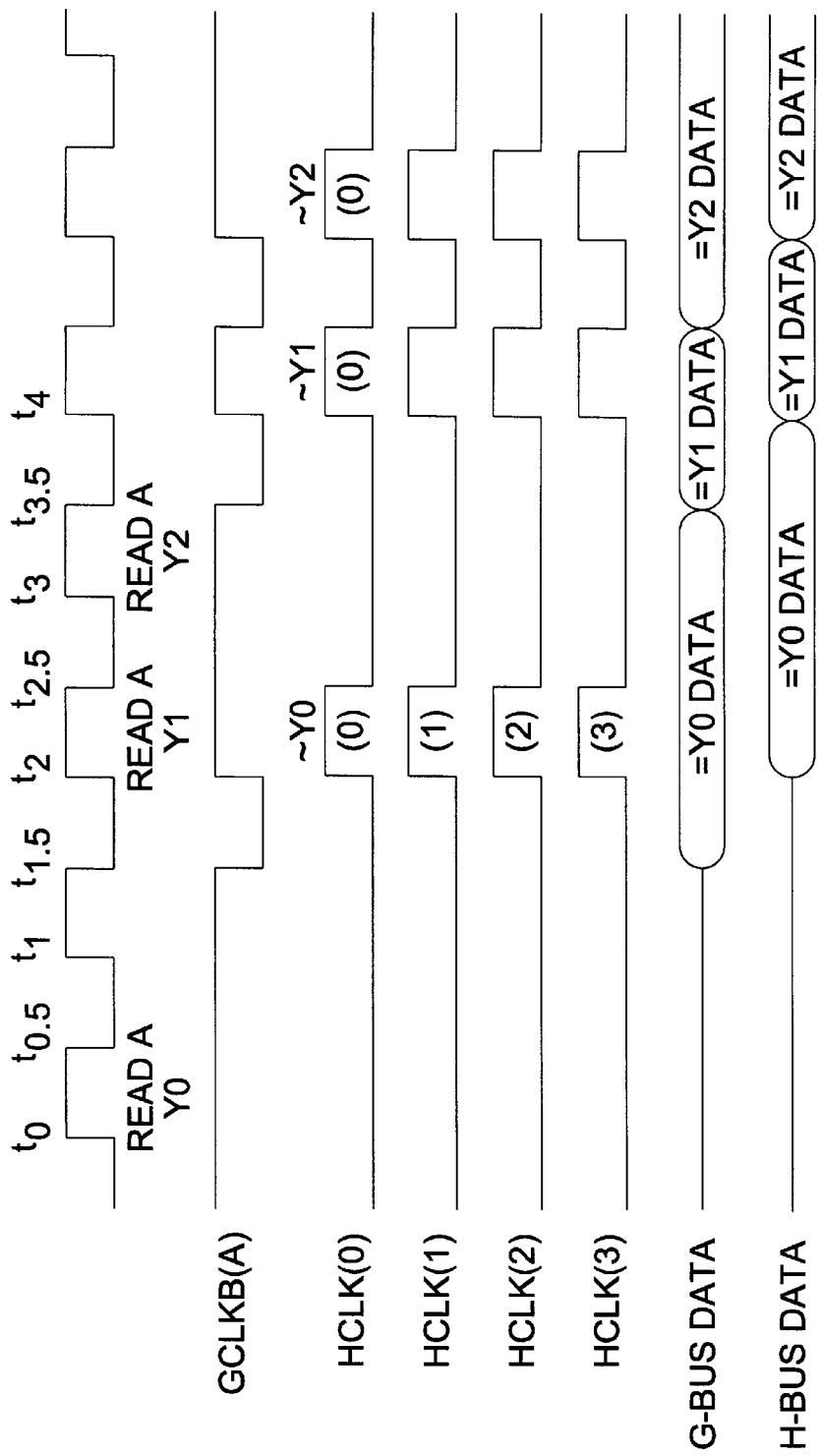
FIGS. 12A through 12D are further representative timing diagrams illustrative of the GCLKB and HCLK signal functionality for a X16 device with CL=3 or 2.5, a X16 device with CL=2, a X8 device with CL=3 or 2.5 and a X4 device where CL=3 respectively.
Figure 12B:
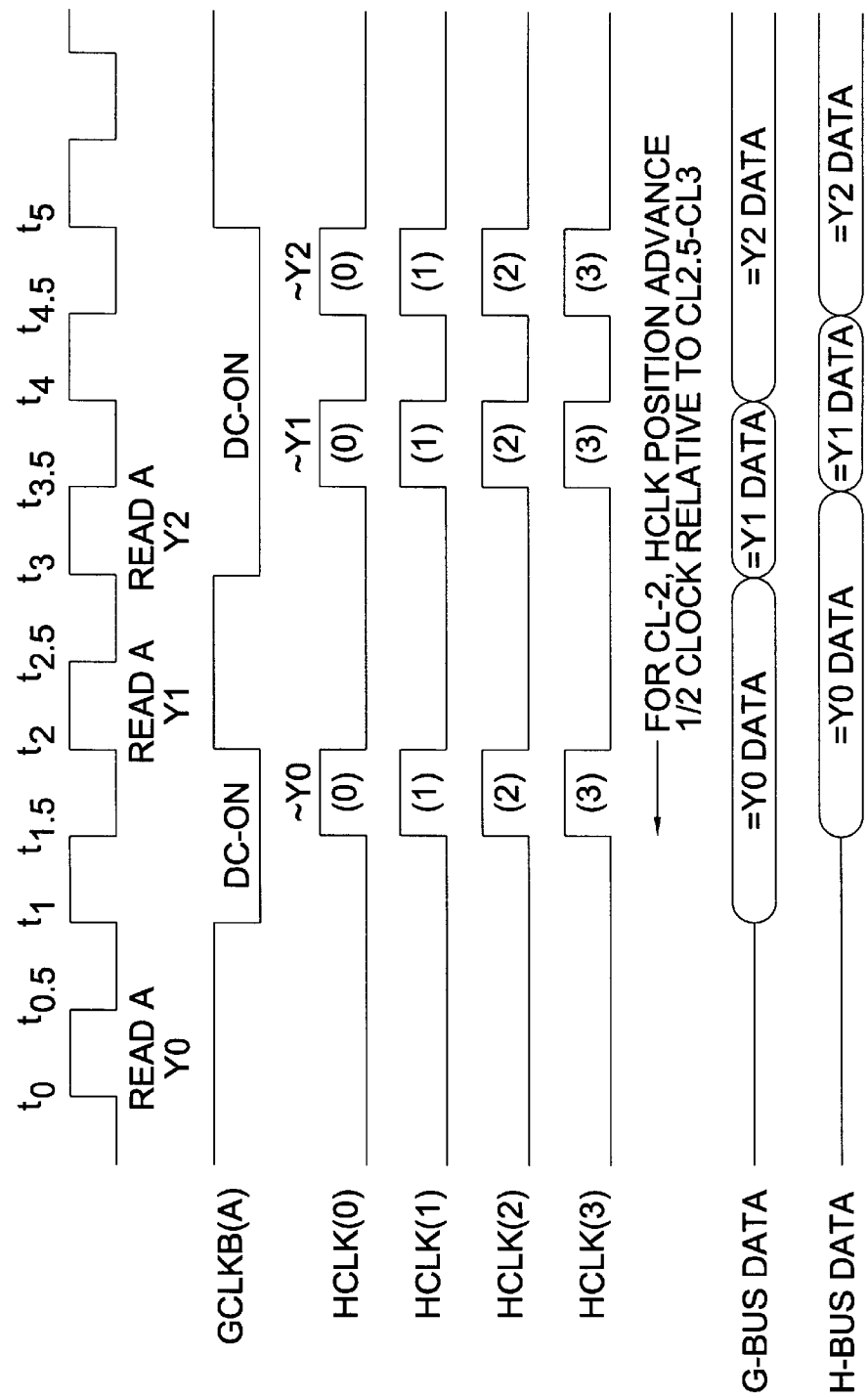
Figure 12C:
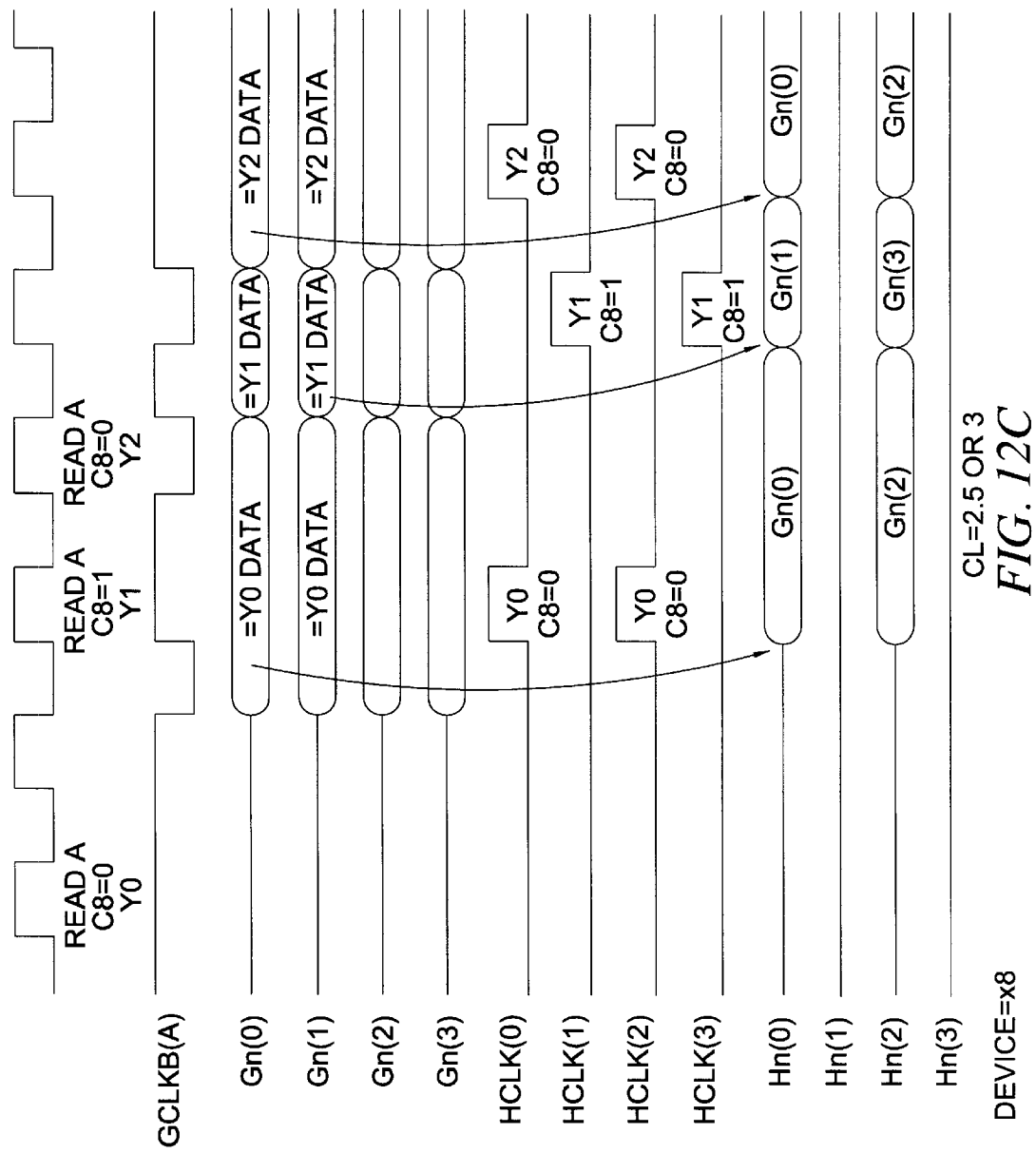
Figure 12D:
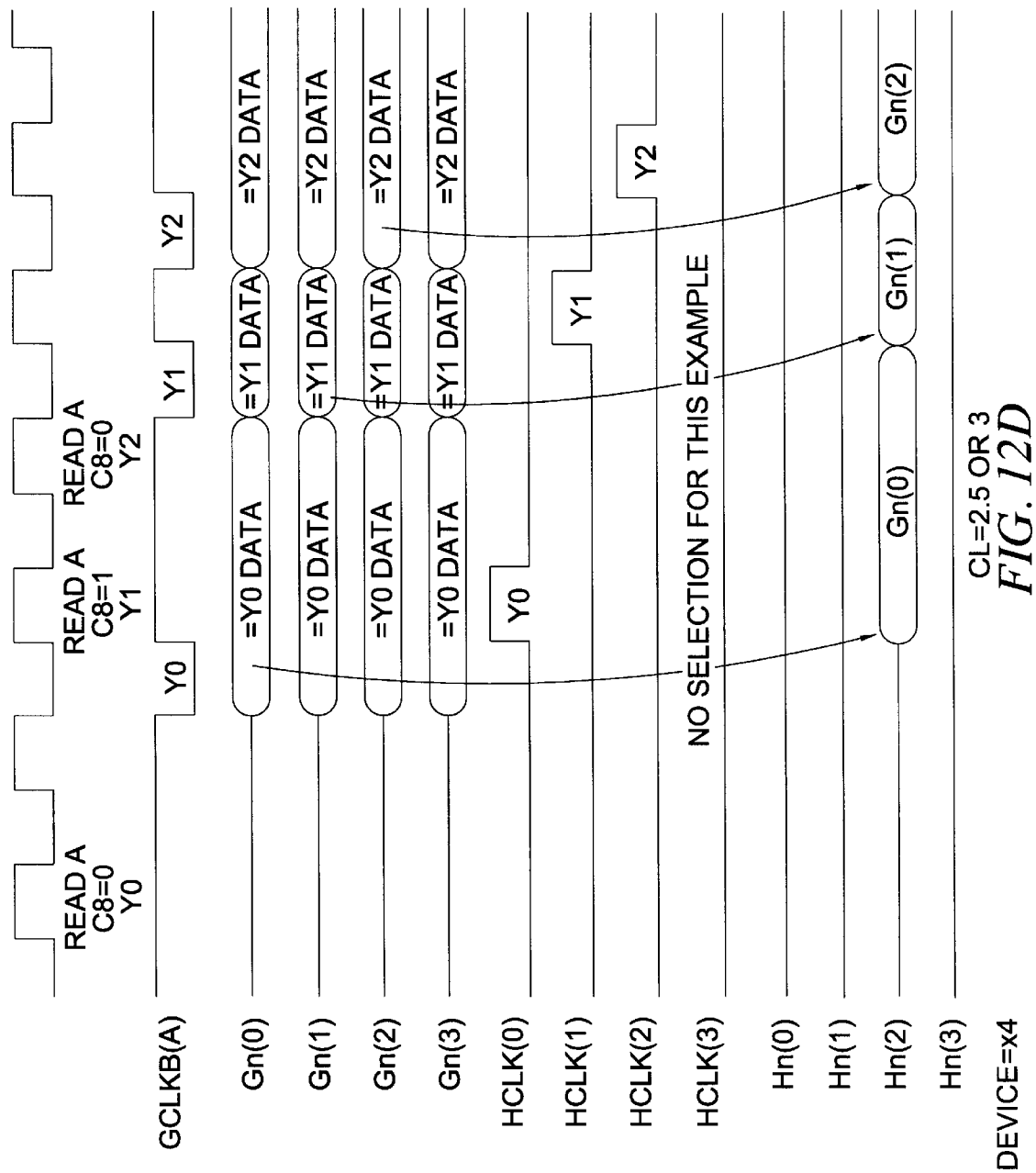
Figure 15:
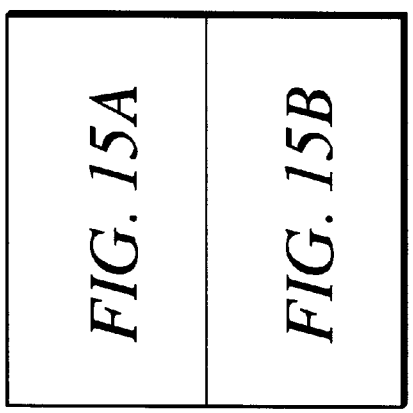
FIGS. 13A–13B, 14A–14B and 15A–15B are further representative timing diagrams illustrative of all five clock signals in the device read path for exemplary configurations of a X4 device with CL=3, a X8 device with CL=2.5 and a X16 device with CL=2 respectively.
Figure 14:
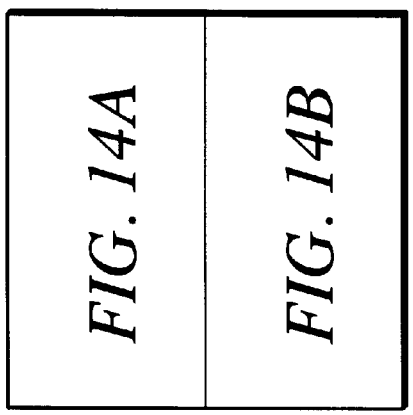
Figure 13:
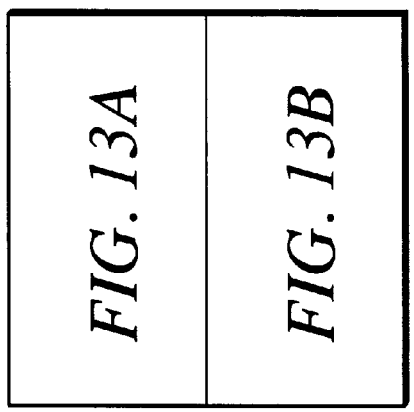
Figure 13A:
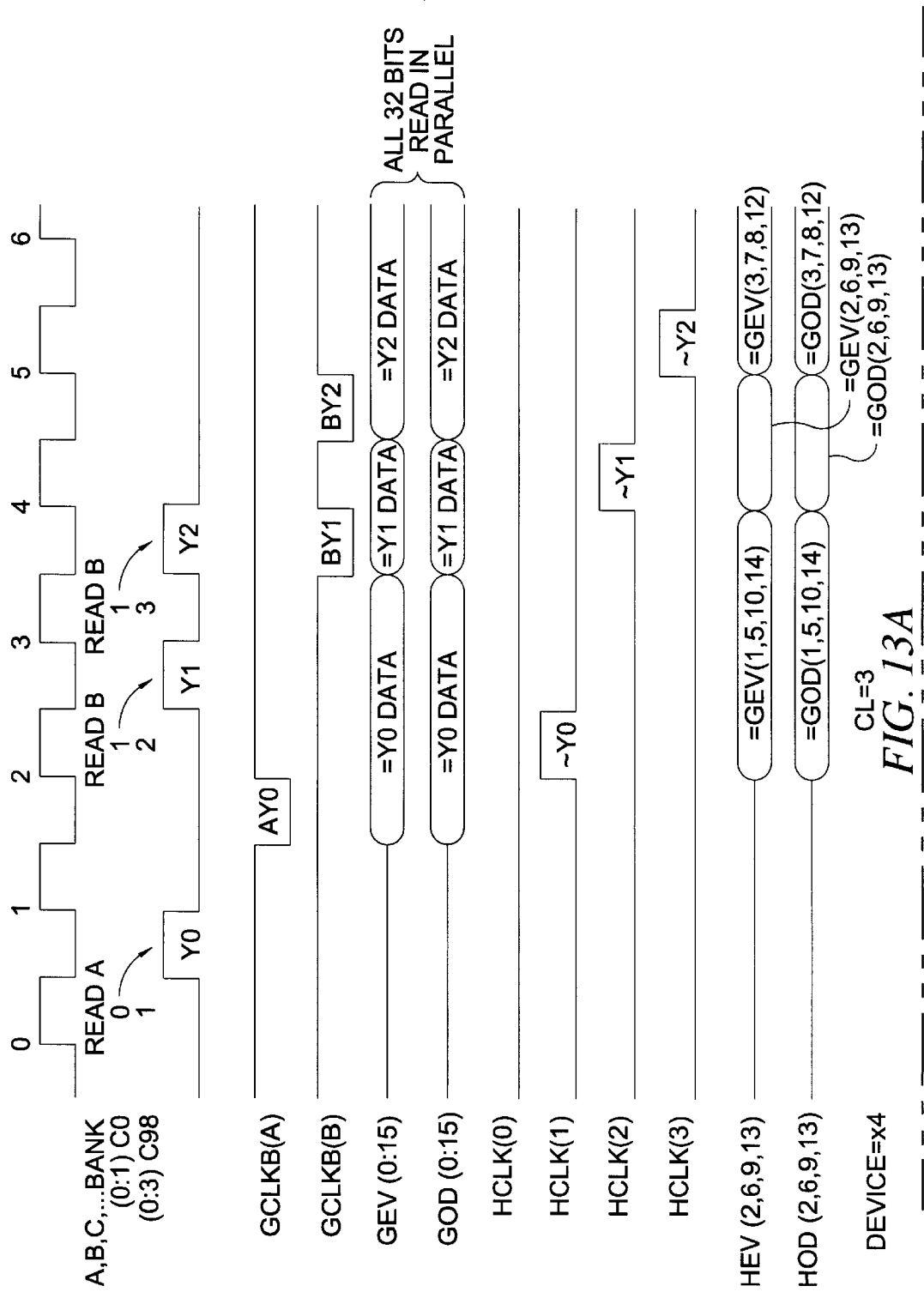
Figure 13B:
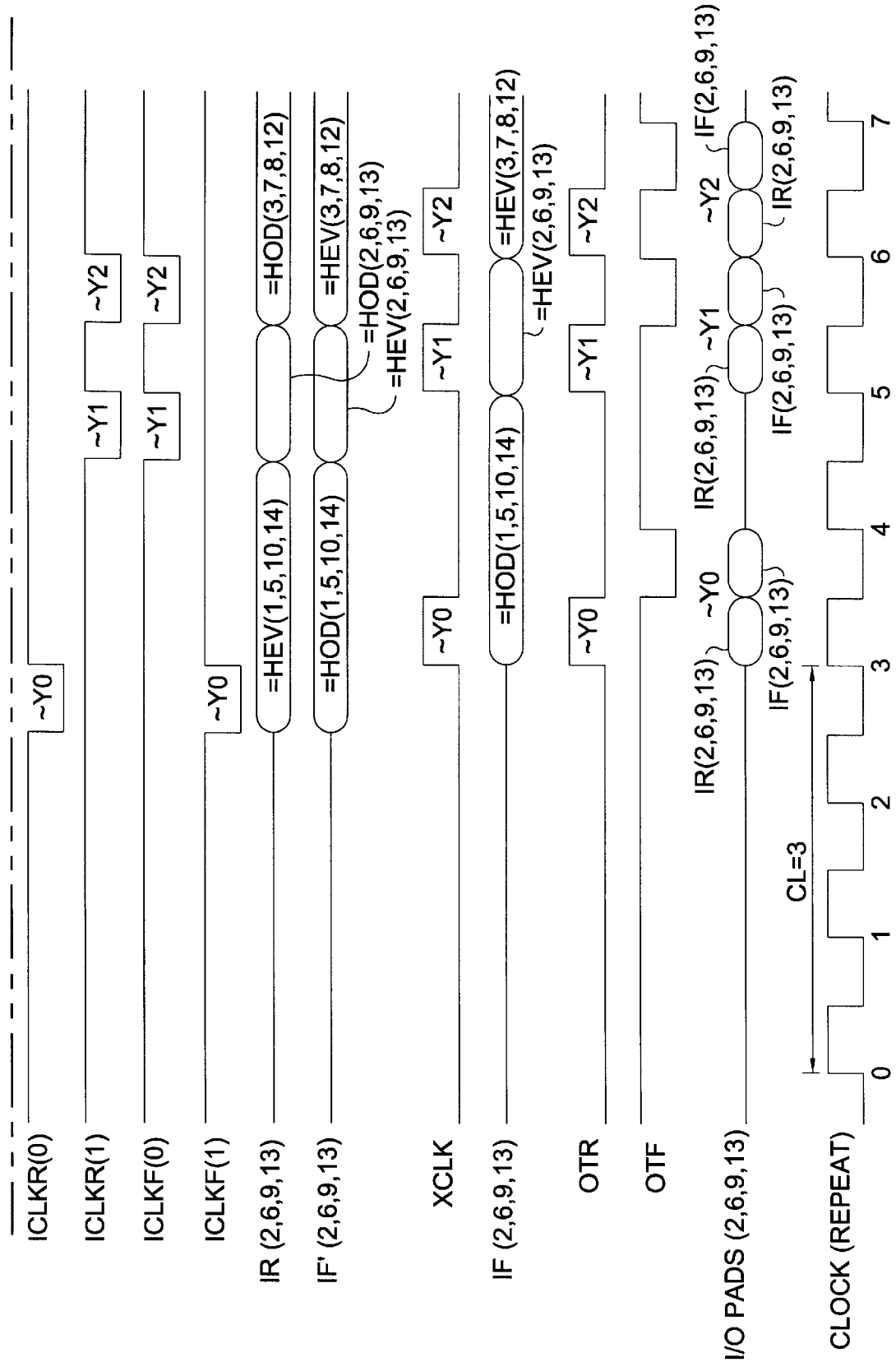
Figure 14A:
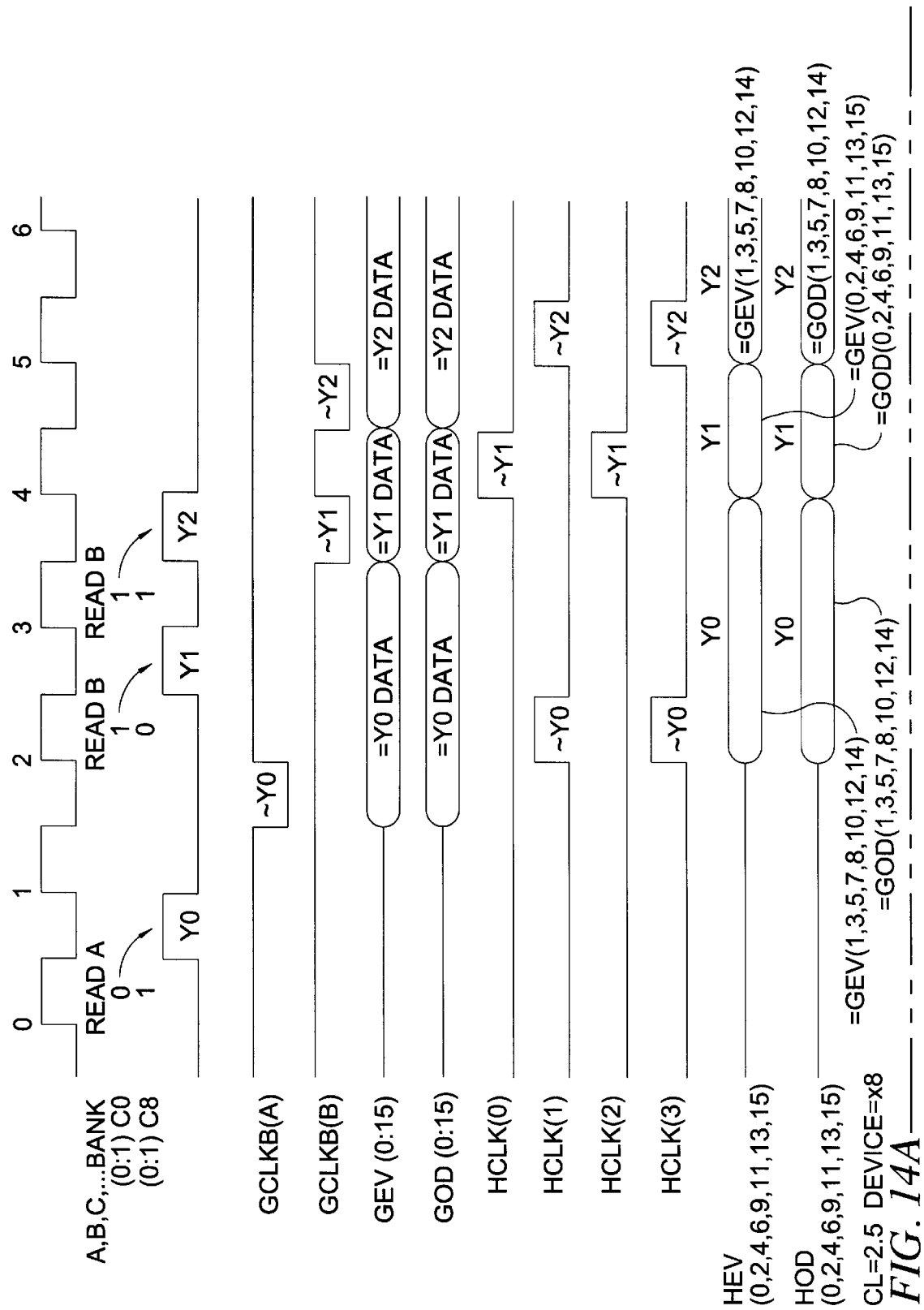
Figure 14B:
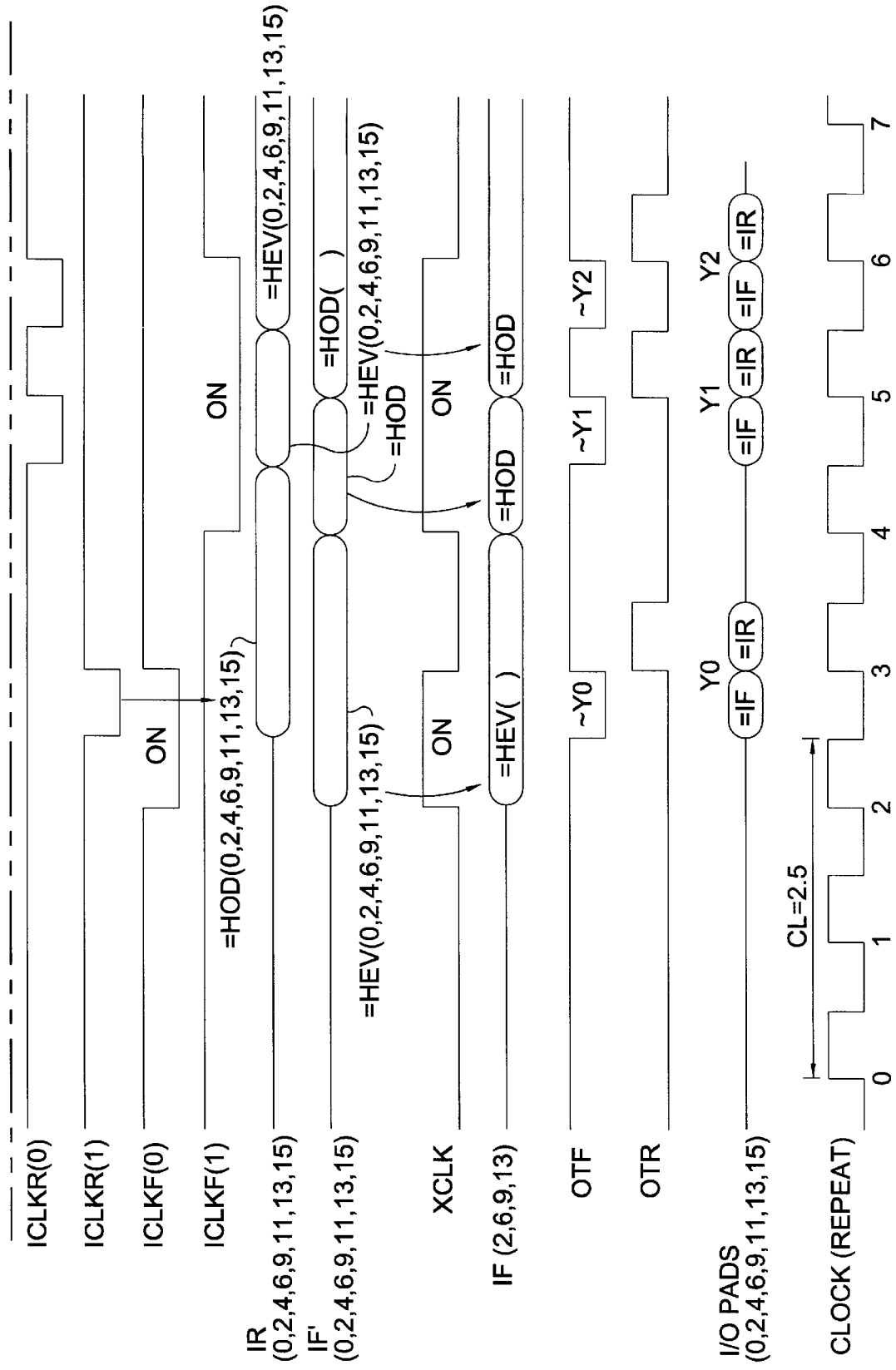
Figure 15A:
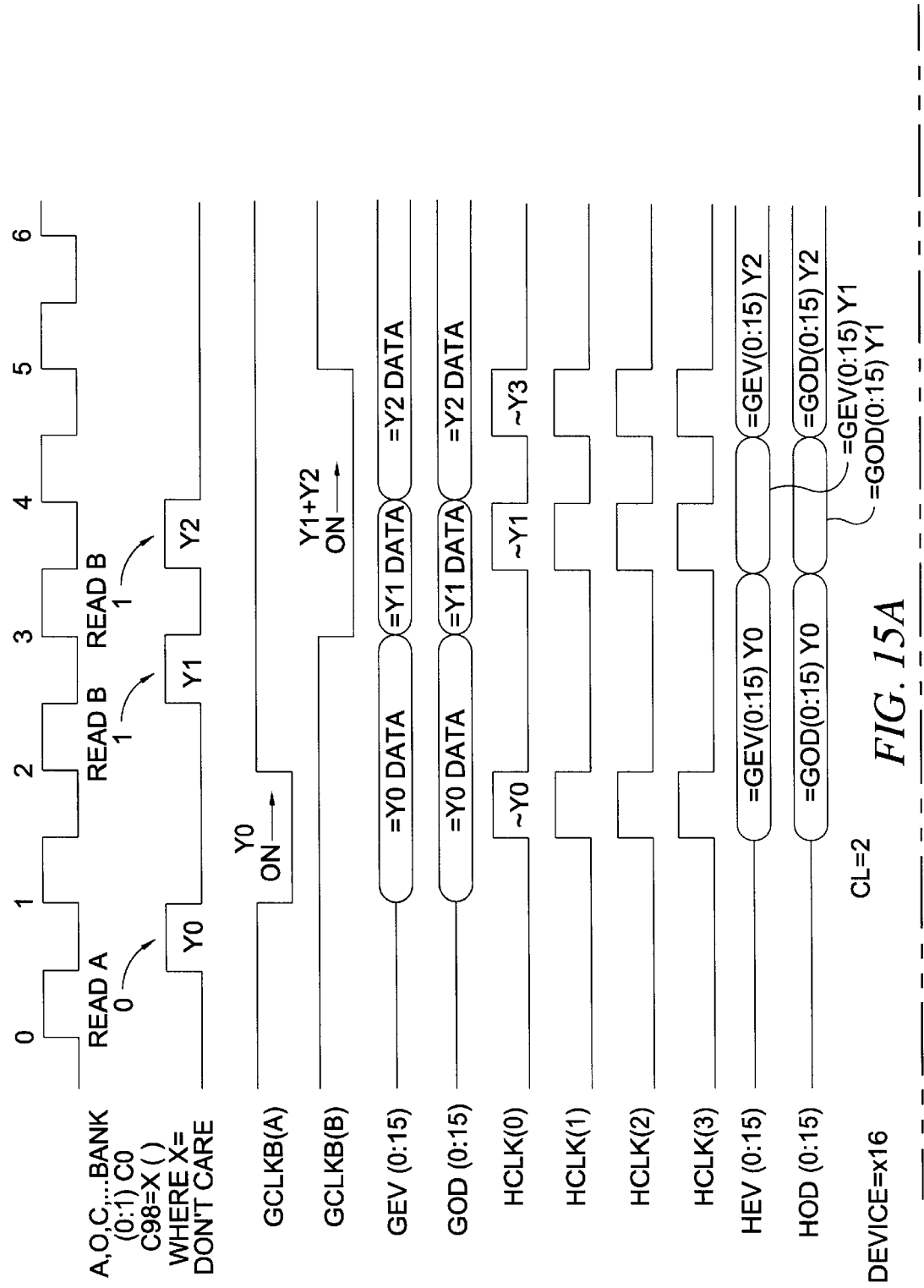
Figure 15B:
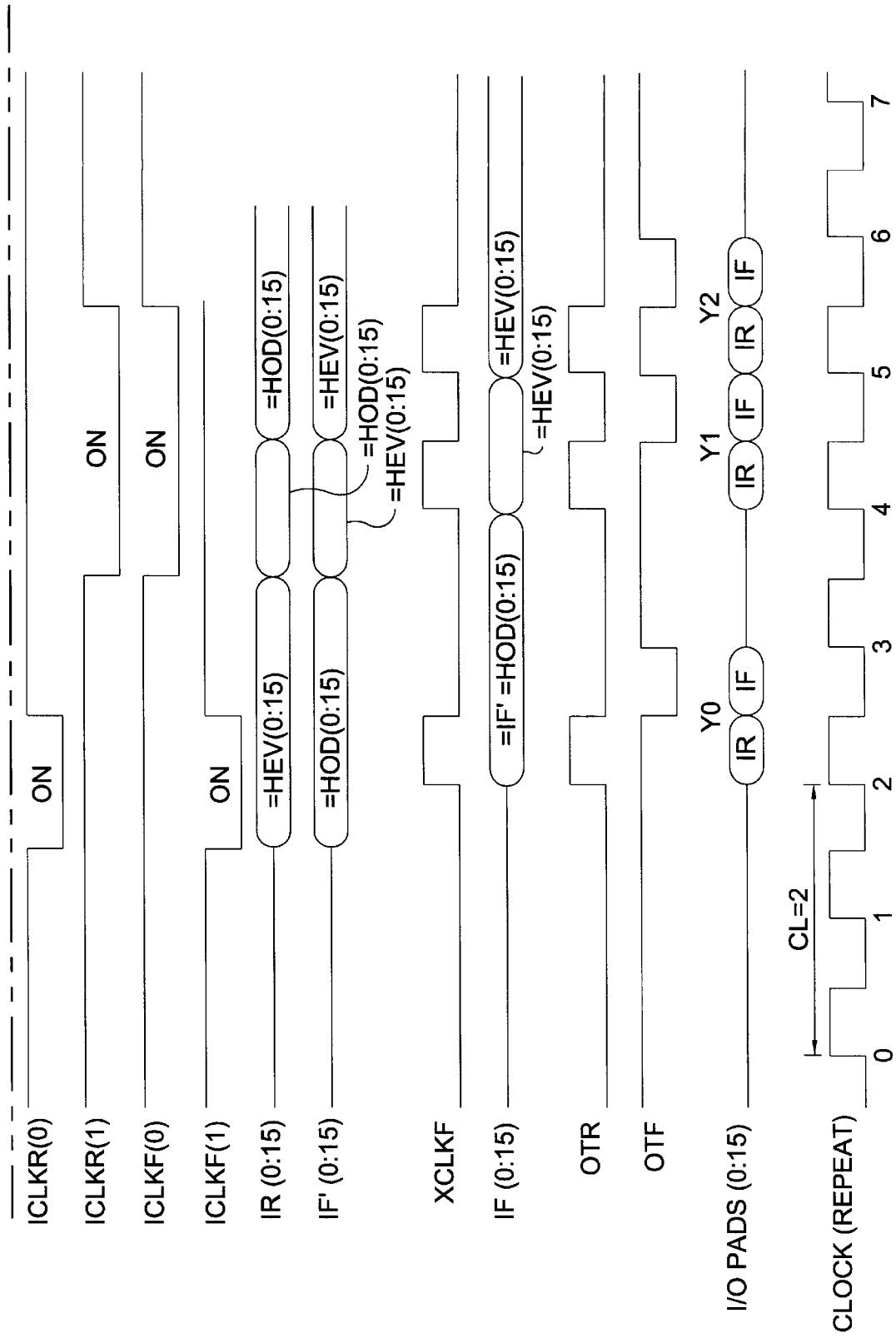

With reference additionally now to FIG. 7, a timing diagram illustrating the relationship of the I and X clock signals to data packets corresponding to a given address "A" is shown. The falling data packet $IF'_A$ is output when the ICLKF(0:1) signal goes "low" while the falling data packet $IF_A$ is output one half cycle later when the XCLKF signal goes "high".

For the case CL=3, ICLKF (0:1) is active "low", and the one half of the bits not selected by the ICLKR are placed onto the IF' bus and held for one data cycle. If the signal ICLKR(0) is active, then ICLKF(1) is active. Alternatively, if ICLKR(1) is active then ICLKF(0) is also active. The XCLKF data to be output on the falling edge path needs to be held for an extra half cycle. In the representative embodiment of the present invention illustrated and described, the XCLKF signal has no function integrated with it, like X4/X8/X16 multiplexing or $C_0$ sorting signals input to the H and I muxes 32, 34 respectively. The XCLKF signal is functional solely to shift all of the IF' bus data one half a cycle, whereupon it becomes the IF data. The XCLKF is active "high" and the $IF_A$ data can now be read by the OTCLKF clock signal.

Figure 8:
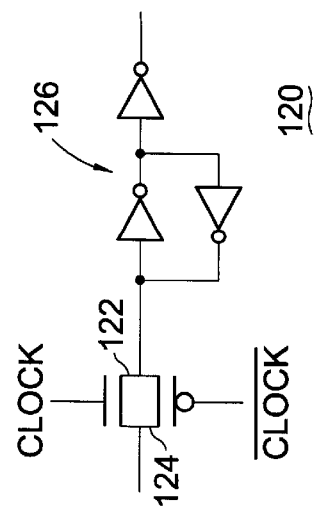
FIG. 8 is a schematic illustration of a complementary metal oxide semiconductor ("CMOS") pass gate and associated register (or latch) comprising a pair of cross coupled inverters illustrative of the fact that each clocking signal illustrated in the preceding figures may actually comprise both a "true"and "complement" (or "bar") signal.

With reference now to FIG. 8, a schematic illustration of a CMOS pass gate and associated register (or latch) is shown illustrative of the fact that each clocking signal illustrated in the preceding figures may actually comprise both a "true" and "complement" (or "bar") clock signal. Each clock signal essentially "grabs" the data available, i.e., for one full cycle, using circuitry in accordance with this representation as an example.

With reference additionally now to FIGS. 9 and 10, representative timing diagrams are shown illustrative of the I clock signal functionality wherein, if "even" data is directed to the "rising" edge data bus, then "odd" data is directed to the "falling" edge data bus and vice versa. Thus, while the signals ICLKR(0) and ICLKF(1) transition to a logic "low" level, the corresponding signals ICLKR(1) and ICLKF(0) are "off". In like manner, while the signals ICLKR(1) and ICLKF(0) transition to a logic "low" level, the corresponding signals ICLKR(0) and ICLKF(1) are "off". The signal ICLKF(0:1) is active low and performs the opposite function of the signal ICLKR(0:1). That is, if C0=0, data is directed to the rising edge, and the other half of the bits, for C0=1, must go to the falling edge (or opposite) if a read command was issued for C0=1.

The memory device 10 of the present invention incorporates a "read" path which supports a latency of CL=3 as well as other latency cases such as CL=2.0 and CL=2.5. The "write" path has a latency of CL=1.0. With respect to the "write" path, the first function in the W muxes 36 is to determine how many lines are valid based on the X4/X8/X16 configuration and perform the proper multiplexing. This function may be effectuated with simple pass gates. As a second function, the data is sorted by the state of a signal A0 at the write command time. The Redat (0:1) clocks perform this function (Rising edge DATA, sort clock).

As an example, if $C_0$=0: IR data is directed to the internal $C_0$ path and Redat(0) is active otherwise, IF data is directed to the internal $C_1$ path and Redat(1) is "off". If $C_0$=1: IR data is directed to the internal $C_1$ path and Redat(1) is active otherwise, IF data is directed to the internal $C_0$ path and Redat(0) is "off".

In operation where CL=2.5 (based on CL=3.0 as the starting point), the memory device 10 is operative to: 1) disable the clocking for XCLKF, this moves the IF data up a half cycle faster. (Note: the XCLKF signal still needs to be only "on" for valid reads, and it does not require a synchronous clocking routine; 2) also disable the clocking for the ICLKF signal, this moves the IF data up another half cycle faster. (If the data is a full cycle faster than for CL=3, there is no change in the IR clocking; and 3) steer the shifted $C_0$ information so that following a "read" command, the first data is directed to the IF path, with the IR data trailing.

For a "read" operation where C0=0: ICLKF(0)=active DC "on"; ICLKF(1)="off"; ICLKR(0)="off"; and ICLKR(0)= active–clocked. Where C0=1: ICLKF(0)="off"; ICLKF(1)= active DC "on"; ICLKR(0)=active—clocked; and ICLKR (1)="off". There is no change in the GCLK or HCLK signals.

For CL=2.0 operation (based on CL=3.0 as a starting point) the memory device 10 is operative to: 1) disable the ICLKR and ICLKF clocking function (that is, to make it DC—"on" if enabled). This moves both the IR and IF data both up one half cycle faster; 2) move the HCLK function one half cycle faster. (The clocking is still enabled, but on the opposite phase of the data path clock, which may be different from the main memory device 10 command clock); and 3) disable the GCLKB clocking function (make it DC—"on" if enabled). This moves the G data up one half cycle. Thus, IR and IF data have both been moved up one full cycle and the first data based on $C_0$ at "read" time is steered to the IR path, just as in the CL=3 case.

Functionally, what has been provided herein is a DDR data path for which the "odd"/"even" sorting, multiple I/O configuration, multiple latency configuration and bi-directional bus control (i.e. "read"/"write" data on the same bus) are all integrated in an efficient and fast memory device 10 design. As previously disclosed, a series of five clocks are utilized to move data through the "read" portion of the data path. This includes the movement of data from the individual memory banks $12_1$ through $12_N$ to the I/O buffers of the memory device 10. In addition, two clocks (REDAT<x>, WEN98<x>) are used to move the "write" data from the memory device 10 I/O pads to the internal memory banks $12_1$ through $12_N$.

"Read" Path

Although in the ensuing discussion, most of the focus is on the clocks that control the memory device 10 "read" path, some attention must also be paid to the "write" clock signals as the read/write busses are shared.

Read Clock #1—This signal is denominated as GCLKB<x> where "x" denotes the bank address. Therefore, each bank has its own GCLKB assigned to it. The primary purpose of this signal is, following a "read" command to a particular memory bank $12_1$ through $12_N$, to fetch the data from that bank at the appropriate time and place it on the appropriate one of the EVEN or ODD data buses 18, 20 comprising the G-bus.

With reference additionally now to Figs. 11A and 11B, timing diagrams are shown illustrative of the GCLKB signal functionality is shown for situations wherein CL=3 or 2.5 and CL=2 respectively. In operation, latency control is handled in the following manner. For CL=2.5 and 3, the GCLKB signal is active between t=1.5 and 2.0 following a "read" command and is synchronous with the low phase of the datapath clock. For CL=2, the clocking function is disabled and the GCLKB signal is active between t=1.0 and 2.0. In this "DC-ON mode", transitions occur only on the "rising" edge of the data path clock, but it does not toggle at the clock frequency as long as it is enabled.

It should be noted that the GCLKB signal has no function relating to memory device 10 I/O configuration and no function relating to odd/even sorting. With respect to bi-directional bus control, if a "read" operation is not to a specific one of the memory banks $12_1$ through $12_N$, then the GCLKB signal is "off". In this state, the output of the G muxes 22 are tri-stated (i.e. "Hi-Z"). If "read" operations are taking place in other one of the memory banks, they have control of the common G-bus. If "write" operations are taking place, then all the GCLKB signals are "off" and the WDSORT circuits have control of the common G-bus.

Read clock #2—This signal is denominated as HCLK<y> where y denotes the 4:1 column decoding address that handles multiple memory device 10 I/O configurations. The main purpose of this signal is to fetch the proper data from the G-bus and place it on the H-bus.

With reference additionally now to FIGS. 12A through 12D, further representative timing diagrams illustrative of the GCLKB and HCLK signal functionality for a X16 device with CL=3 or 2.5, a X16 device with CL=2, a X8 device with CL=3 or 2.5 and a X4 device where CL=3 or 2.5 are respectively shown. In operation, latency control is handled in the following manner. For CL=2.5 and CL=3, the HCLK signals fire at t=2.0 following a "read" command, are synchronous with the data path clock and are always valid for 0.5 cycles. (i.e. from t=2.0 to 2.5. For the case of CL=2, the HCLK signal is advanced by 1/2 cycle. That is, it is valid from t=1.5 to 2.0.

Changes in the memory device 10 I/O configuration are handled in the following manner. As the I/O configuration changes to smaller widths, additional column addresses are added to the memory device 10 address field. The internal data path is designed to be sufficiently wide to support the maximum I/O configuration of the memory device 10, for example, a X16. In this regard, sufficient HCLK signals are required to select the minimum I/O width from the maximum width. In the exemplary implementation disclosed herein, the minimum width is X4, so a 4:1 selection process within the H MUXes 32 is used. This then requires four HCLK signals (HCLK<0:3>). In the case of a X16 configuration, no multiplexing is required, and all four HCLK signals essentially function in parallel.

For a X8 configuration, the HCLK<0,2> signals work opposite that of HCLK<1,3> to perform a 2:1 selection process. In a X4 part, only one HCLK<0:3> signal is valid for a given cycle thereby performing the 4:1 selection process. As previously described, the HCLK signals are ultimately "steered" to the proper multiplexing point for a given memory device 10 configuration.

It should be noted that the HCLK signals have no function related to odd/even sorting. Data from the ODD data bus 20 portion of the G-bus is forwarded to the ODD H-bus. Similarly, the data on the EVEN data bus 18 portion of the G-bus is forwarded to the EVEN H bus. The HCLK signals also have no function relating to bus control. At this point in the memory device 10, the H-bus is dedicated to "read" data only and is not common with the "write" path.

Read clock #3—This signal is denominated as ICLKR (0:1) and its primary function is to select either the "odd" or "even" data from the H-bus and to place it on the "rising" output path. To recapitulate, if CO=O at the time the "read command" was given, ICLKR<O> fires and places the "even" data on the "rising" I-bus. If instead C0=1 at command time, ICLKR<1> fires and places the "odd" data on the "rising" I-bus (IR). In the CL=2.5 instance, the response to the CO command is the opposite and a "read" command with CO=O will result in ICLKR<1> firing.

Latency changes are handled in the following manner. For CL=2.5 and 3, the ICLKR signal, if selected, is "active" on the low phase of the datapath clock at t=2.5 cycles after the "read" command with a duration of 0.5 cycles. For CL=2, the clocking function is disabled (i.e. DC-on). Transitions occur near the t=2.0 edge, but it does not toggle at the clock frequency.

With respect to this signal, there is bi-directional bus control as the IR-bus is shared with "write" data. Therefore, when the ICLKR(O) and ICLKR(1) signals are "off", the drivers from the I Muxes 34 are in the tri-state or "Hi-Z" condition. The ICLKR signals have no function related to multiple I/O configurations (i.e. the X4/X8/X16 selection).

Read clock #4—This signal is denominated as ICLKF (0:1) and is very similar to ICLKR, with only minor differences. In this regard, it places data from the H-bus to the IF' bus. Its primary function is to select either the "odd" or "even" data from the H-bus to place on the "falling" output path. As previously described, if CO=O at the time the "read" command was issued, ICLKF<1> fires and places the "odd" data on the "falling" I-bus. If C0=1 at command time, ICLKF<O> fires and places the "even" data on the "falling" I-bus (IF). In the CL=2.5 case, the response to the CO is the opposite and a "read" command with CO=O will result in ICLKF<O> firing.

Essentially, in order to effectuate the appropriate sorting, the ICLKR and ICLKF signals are always selecting the opposite bits. If "even" data is directed to the "rising" bus, then "odd" data must be directed to the "falling bus" and vice versa. The ICLKF signal has no function relating to bi-directional buses. This is because, in order to support the case where CL=3, the "falling" path has the extra register (the X mux) supported by the XCLKF signal. Consequently, the IF' bus which connects the I mux 34$_{FALLING}$ to the X mux is "read only" data. The ICLKF signal also has no function relating to the memory device 10 multiple I/O configurations.

For latency control in the case of CL=3, the ICLKF signal is the same as the ICLKR signal and it occurs in phase with the data path clock at t=2.5 to 3.0 (duration=0.5 cycle). For CL=2.5 and 2.0, the clocking function is disabled and it is valid from t=2.0 to 3.0 if selected. Transitions occur at the t=2.0 point, but there is no toggling at the data path clock frequency.

Read clock #5—This signal is denominated as XCLKF and its primary purpose is to clock the data out of the extra register stage in the falling data path (the X mux) and to connect IF' bus to IF bus. Again, it should be noted that the XCLKF signal has no function with respect to "odd" and "even" data sorting operations as the data on the IF' bus has previously been sorted. Neither does it have a function related to the memory device 10 multiple I/O configurations.

With respect to latency control, in the CL=3 case, the XCLKF signal occurs at t=3.0 to 3.5. This is the same time at which data from the "rising" path (IR data) is being placed on the memory device 10 output pads. Data on the "falling" path must be stored an extra half cycle while this takes place. In the case of CL=2.5, if selected, the XCLKF signal is valid from t=2.0 to 3.0. This matches the ICLKF<0:1> signal. Since the XCLKF signal is "DC-On" at this point, it does not toggle at the clock frequency. In the case of CL=2.0, the clocking is enabled, but the timing is advanced one full cycle. Consequently, the XCLKF signal is now valid from t=2.0 to 2.5. It should be noted that the XCLKF signal does have a critical function related to bi-directional bus control. That is, if it is "off", the drivers are in the "Hi-Z" state so the IF bus can be controlled by the "write" circuits if so desired.

"Write" Path

The "write" path has a fixed latency of (1) so there is no provision for latency control features in the embodiment disclosed herein. In the exemplary implementation of the present invention disclosed, the "write" path only has two clocks: REDAT<0:1> to effectuate the "odd"/"even" sorting and WEN98<0:3> for bi-directional G-bus control. As mentioned previously, this portion of the memory device 10 is disclosed in greater detail in the aforementioned copending pending U.S. patent application Ser. No. 09/527,043.

The multiple memory device 10 I/O configurations are handled with relatively straightforward DC steering of the input data. The first stage of the "write" path is the W muxes 36. Data from the IR and IF buses is input, and with the use of simple pass gate steering, adjusted to accommodate the various I/O configurations (e.g. X4/X8/X16). The output from the W muxes 36 may be denoted as the WDR and WDF data for rising and falling respectively. In the WDSORT blocks 38, the REDAT<0:1> clocks sort the input "rising" and "falling" data into the "odd" and "even" paths depending upon the state of the signal AO when the "write" command was given (CO).

The output from the WDSORT blocks 38 is also controlled by the WEN98<0:3> clock signals. These clock signals simply enable the WDSORT drivers connecting to the G-bus. When not writing, the drivers must be in a tri-state condition so that the read path G muxes 22 may have control of the G-bus. Embedded in the WEN98 clocks is also some X4/X8 multiplexing information, hence, the presence of four actual clocks (0:3). This is primarily a power savings feature so in a X4 application, only the 4 G-lines needed are driven and not the entire bus width of 16 G-lines. For X8 configurations, half the lines are driven. Nevertheless, the full field of lines is needed for a X16 application and the four WEN98 clocks merely move in unison. Further, the X4/X8 selection of the WEN98 clocks is, of course, mapped to match the HCLK(0:3) signals selection process so the "read" data matches the "write" data.

With reference additionally now to FIGS. 13A–13B, 14A–14B and 15A–15, further representative timing diagrams are shown illustrative of all five clock signals in the memory device 10 "read" path for exemplary configurations of a X4 device with CL=3, a X8 device with CL=2.5 and a X16 device with CL=2 respectively.

While there have been described above the principles of the present invention in conjunction with specific device architecture and layout, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit memory device comprising:
   at least one memory bank, said memory bank being logically partitioned into even and odd portions thereof;
   even and odd data buses, said even and odd portions of said memory bank being selectively couplable to said even and odd data buses respectively for placing read data thereon by means of corresponding first multiplexers in response to a first control signal; and
   a read pipeline sorting block coupled to said even and odd data buses for selectively applying said read data on said even data bus to either of a rising or falling edge data output bus and said read data on said odd data bus to an opposite one of said rising or falling edge data output buses.

2. The memory device of claim 1 further comprising:
   a write pipeline sorting block coupled to said rising and falling edge data buses for receiving write data thereon; said write pipeline sorting block for selectively applying said write data on said rising edge data bus to either of said even or odd data buses and said write data on said falling edge data bus to an opposite one of said even or odd data buses.

3. The memory device of claim 1 wherein said at least one memory bank comprises first, second, third and fourth memory banks.

4. The memory device of claim 1 wherein said even and odd portions of said at least one memory bank are selectively couplable to said even and odd data buses respectively by means of a number of first multiplexers responsive to a bank select signal.

5. The memory device of claim 4 wherein said read pipeline sorting block comprises second even and odd multiplexers coupled to said even and odd data buses responsive to a device input/output configuration signal.

6. The memory device of claim 5 wherein said read pipeline sorting block comprises third rising and falling read data multiplexers coupled to said rising and falling edge data output buses respectively, each of said third rising and falling read data multiplexers being selectably couplable to an output of one of said second even and odd multiplexers in response to a sorting signal.

7. The memory device of claim 2 wherein said write pipeline sorting block comprises fourth rising and falling write data multiplexers.

8. The memory device of claim 7 wherein said write pipeline sorting block comprises odd and even write data sorting circuits coupled to said odd and even data buses respectively, each of said odd and even write data sorting circuits being selectively couplable to an output of one of said fourth rising and falling write data multiplexers in response to a rising edge data signal.

9. The memory device of claim 1 further comprising first and second switching devices coupling said rising and falling edge data output buses to input/output terminals of said memory device, said first and second switching devices being respectively responsive to first and second output clocking signals.

10. The memory device of claim 9 further comprising a rising data register coupled to said rising edge data output bus.

11. The memory device of claim 9 further comprising first and second falling data registers coupled to said falling edge data output bus.

12. The memory device of claim 9 further comprising a third switching device intermediate said first and second falling data registers, said third switching device being responsive to a latency control signal.

13. A read data pipeline for a double data rate memory device comprising:
    a plurality of memory banks from which data may be read, each of said plurality of memory banks having even and odd portions thereof;
    even and odd data buses selectively couplable to said even and odd portions of said plurality of memory banks in response to a bank select signal; and
    a read pipeline sorting block coupled to said even and odd data buses and responsive to device I/O configuration and sorting signals for selectively applying said read data on said even data bus to either of a rising or falling edge data output bus and said read data on said odd data bus to an opposite one of said rising or falling edge data output buses in response to said device I/O configuration and sorting signals.

14. The read data pipeline of claim 13 wherein said even and odd data buses are selectively couplable to said even and odd portions of said plurality of memory banks by means of a number of first multiplexers responsive to said bank select signal.

15. The read data pipeline of claim 13 wherein said read pipeline sorting block comprises second even and odd multiplexers coupled to said even and odd data buses respectively, said second even and odd multiplexers being responsive to said device I/O configuration signal.

16. The read data pipeline of claim 15 wherein said device I/O configuration signal also provides latency control.

17. The read data pipeline of claim 15 wherein said read data pipeline sorting block further comprises third rising and falling read data multiplexers coupled to said rising and falling edge data output buses respectively, each of said third rising and falling read data multiplexers being selectively couplable to an output of one of said second even and odd multiplexers in response to said sorting signal.

18. The read data pipeline of claim 17 wherein said sorting signal also provides latency control.

19. The read data pipeline of claim 17 further comprising a rising edge data register coupled to said rising edge data output bus.

20. The read data pipeline of claim 19 further comprising first and second falling data registers coupled to said falling edge data output bus.

21. The read data pipeline of claim 20 further comprising first and second switching devices coupling said rising and falling edge data output buses to input/output terminals of said memory device, said first and second switching devices being respectively responsive to first and second output clocking signals.

22. The read data pipeline of claim 20 further comprising a third switching device intermediate said first and second falling data registers, said third switching device being responsive to a latency control signal.

23. The read data pipeline of claim 14 wherein each of said number of first multiplexers are capable of being placed in one of an "on", "off" or high impedance state.

24. The read data pipeline of claim 19 wherein each of said third rising and falling read data multiplexers are capable of being placed in one of an "on", "off" or high impedance state.

* * * * *